(12) United States Patent
Sonehara et al.

(10) Patent No.: US 9,906,215 B2
(45) Date of Patent: Feb. 27, 2018

(54) LOAD-DRIVING CIRCUIT

(71) Applicant: Hitachi Automotive Systems, Ltd., Hitachinaka-shi, Ibaraki (JP)

(72) Inventors: Masahito Sonehara, Hitachinaka (JP); Youichirou Kobayashi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/116,093

(22) PCT Filed: Dec. 8, 2014

(86) PCT No.: PCT/JP2014/082357
§ 371 (c)(1),
(2) Date: Aug. 2, 2016

(87) PCT Pub. No.: WO2015/118768
PCT Pub. Date: Aug. 13, 2015

(65) Prior Publication Data
US 2017/0179939 A1    Jun. 22, 2017

(30) Foreign Application Priority Data

Feb. 6, 2014  (JP) .................................. 2014-020903

(51) Int. Cl.
*H03K 17/082*  (2006.01)
*H03K 17/06*   (2006.01)

(52) U.S. Cl.
CPC ....... *H03K 17/0822* (2013.01); *H03K 17/063* (2013.01); *H03K 2217/0027* (2013.01);
(Continued)

(58) Field of Classification Search
CPC ............. H03K 17/0822; H03K 17/063; H03K 2217/0072; H03K 2217/0063; H03K 2217/0027
See application file for complete search history.

(56) References Cited

U.S. PATENT DOCUMENTS

| 8,018,213 B2 | 9/2011 | Arndt |
| 8,498,089 B2 | 7/2013 | Lorentz et al. |

(Continued)

FOREIGN PATENT DOCUMENTS

| EP | 1 841 052 A2 | 10/2007 |
| JP | 2007-78427 A | 3/2007 |

(Continued)

OTHER PUBLICATIONS

International Search Report (PCT/ISA/210) issued in PCT Application No. PCT/JP2014/082357 dated Mar. 31, 2015 with English-language translation (two (2) pages).

(Continued)

*Primary Examiner* — Jung Kim
(74) *Attorney, Agent, or Firm* — Crowell & Moring LLP

(57) ABSTRACT

A load-driving circuit for receiving a supply of power from a power source and driving a load, wherein the load-driving circuit is provided with: a high-side switching element; a low-side switching element; a high-side current detection circuit connected in parallel to the high-side switching element, the high-side current detection circuit detecting a high-side driving current; and a fault detection circuit for detecting the fault state of the load-driving circuit from the output result of the high-side current detection circuit. The high-side current detection circuit is provided with a high-side sense switching circuit operating in response to a gate signal that is different from the high-side switching element, the high-side sense switching circuit comprising a device of the same type as the high-side switching element. The output (Continued)

result of the high-side current detection circuit, the gate signal of the high-side switching element, and the gate signal of the high-side sense switching element are input and the fault states are detected apart from each other when the connection terminal between the load-driving circuit and the load is in a state of short circuit with the positive electrode side of the power source or in a state of short circuit with the negative electrode side of the power source.

15 Claims, 23 Drawing Sheets

(52) U.S. Cl.
CPC ............ *H03K 2217/0063* (2013.01); *H03K 2217/0072* (2013.01)

(56) References Cited

U.S. PATENT DOCUMENTS

| | | |
|---|---|---|
| 2006/0038238 A1 | 2/2006 | Lotfi et al. |
| 2009/0219661 A1* | 9/2009 | Mitsuda ............ H03K 17/0822 361/92 |
| 2010/0308872 A1 | 12/2010 | Gillberg |
| 2011/0002073 A1 | 1/2011 | Fukuda et al. |
| 2012/0074922 A1 | 3/2012 | Suzuki et al. |
| 2015/0364913 A1* | 12/2015 | Minoya ................ H02H 9/025 361/93.9 |
| 2016/0202305 A1* | 7/2016 | Umeno ............... G01R 31/025 324/509 |

FOREIGN PATENT DOCUMENTS

| | | |
|---|---|---|
| JP | 2010-62737 A | 3/2010 |
| JP | 2010-178019 A | 8/2010 |
| JP | 2011-114739 A | 6/2011 |

OTHER PUBLICATIONS

Japanese-language Written Opinion (PCT/ISA/237) issued in PCT Application No. PCT/JP2014/082357 dated Mar. 31, 2015 (three (3) pages).

Corresponding European Search Report dated Dec. 14, 2017 (11 pages).

* cited by examiner

LOAD-DRIVING CIRCUIT

TECHNICAL FIELD

The present invention relates to a load-driving circuit.

BACKGROUND ART

Progress has conventionally been made in electronically controlling various devices that are mounted in a vehicle. In step with this, electric actuators such as motors and solenoids are in wide use to convert an electrical signal into mechanical motion or hydraulic pressure. It is necessary to detect a fault in a load-driving circuit that drives current flowing through these electric actuators to control the electric actuators safely.

As a general method for detecting a fault in the load-driving circuit, there is a method for detecting a short circuit state of the load-driving circuit by inserting a current sense resistor in series between the load-driving circuit targeted for detection and a load and measuring the voltage across the current sense resistor. However, there is a problem with such a method that a loss of power occurs due to the current sense resistor. Hence, a method is known in which a current detection circuit including a small current sense transistor and the like is connected in parallel to a driver transistor that drives an electric actuator targeted for control to detect the current flowing through the current detection circuit and accordingly the detection of fault in the load-driving circuit is achieved with a small loss.

CITATION LIST

Patent Literature

PTL 1: Japanese Patent Application Laid-open No. 2007-78427

SUMMARY OF INVENTION

Technical Problem

An overcurrent detection circuit of PTL 1 is described to be a circuit that detects overcurrent, in terms of a switching current flowing through a P-channel MOS transistor (hereinafter referred to as PMOS), in a switching element including the PMOS connected to a positive electrode side (hereinafter referred to as high side) of a direct current power source and a switching element including an N-channel MOS transistor (hereinafter referred to as NMOS) connected to a ground side (hereinafter referred to as low side). However, faults that can be detected based on the overcurrent in the PMOS used on the high side are limited to a fault where a connection terminal between an inductor being a load and a switching element that drives the load is short-circuited to the ground side (hereinafter referred to as the ground fault). As an example of a fault other than the ground fault, there is a fault that the connection terminal between the inductor and the switching element is short-circuited to the positive electrode side of the direct current power source (hereinafter referred to as the power source fault). However, in the power source fault, overcurrent occurs in the NMOS used on the low side, but overcurrent does not occur in the PMOS used on the high side. Accordingly, the fault cannot be detected.

In this manner, a single fault state can be detected in the known fault detection circuit. However, consideration has not been given to the detection of a plurality of fault states.

A main object of the present invention is to provide a fault detection circuit that can detect a plurality of fault states, considering the above problem.

Solution to Problem

In order to solve the above problem, for example, configurations described in the claims are adopted. The present application includes a plurality of means to solve the above problem, and an example thereof is a load-driving circuit for receiving the supply of power from a power source to drive a load, including: a high-side switching element, connected to a positive electrode side of the power source, for outputting a high-side driving current; a low-side switching element, connected to a negative electrode side of the power source, for outputting a low-side driving current; a high-side current detection circuit, connected in parallel to the high-side switching element, for detecting the high-side driving current; and a fault detection circuit for detecting a fault state of the load-driving circuit from an output result of the high-side current detection circuit, wherein the high-side current detection circuit includes a high-side sense switching element, including a device of the same type as the high-side switching element, for operating on a gate signal different from that of the high-side switching element, and when a connection terminal between the load-driving circuit and the load is short-circuited to the positive electrode side of the power source, or short-circuited to the negative electrode side of the power source, the fault detection circuit detects the fault states distinguishing them, with the output result of the high-side current detection circuit, the gate signal of the high-side switching element, and the gate signal of the high-side sense switching element as inputs.

Advantageous Effects of Invention

According to the present invention, it is possible to provide a fault detection circuit that can detect a plurality of fault states. Problems, configurations, and effects other than those described above will become clear from the following description of embodiments.

DESCRIPTION OF EMBODIMENTS

The configuration and operation of a fault detection circuit that can detect a plurality of fault states are described in the following embodiments.

First Embodiment

Figure 1:
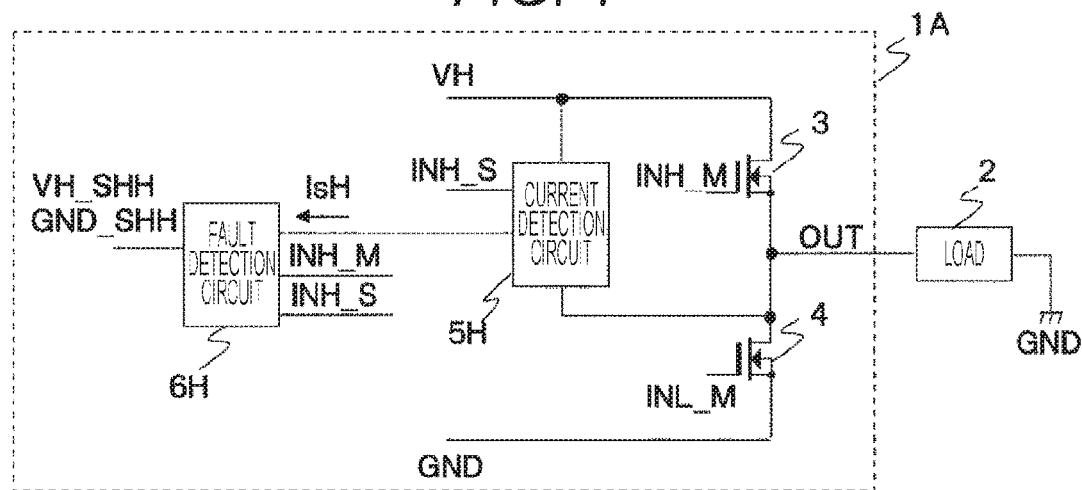
FIG. 1 is a block diagram illustrating a load-driving circuit according to a first embodiment of the present invention.

FIG. 1 is a block diagram illustrating the configuration of a load-driving circuit 1A and an electromagnetic load 2 according to a first embodiment of the present invention. The load-driving circuit 1A illustrated in FIG. 1 is connected at its terminal OUT to the electromagnetic load 2, and includes a high-side switching element 3 including an NMOS, receives the supply of power from a positive electrode side VH of a direct current power source, and controls on and off with a gate signal INH_M, a low-side switching element 4 including an NMOS, receives the supply of power from a ground side GND of the direct current power source, and controls on and off with a gate signal INL_M, a current detection circuit 5H connected in parallel to the high-side switching element 3 to output a sense current IsH proportional to the voltage between the drain and the source of the high-side switching element 3, and a fault detection circuit 6H that detects a fault state of the load-driving circuit 1A from the sense current IsH. Moreover, it is configured such that the electromagnetic load 2 is connected at its other terminal to GND (hereinafter the high-side driver configuration).

Figure 2:
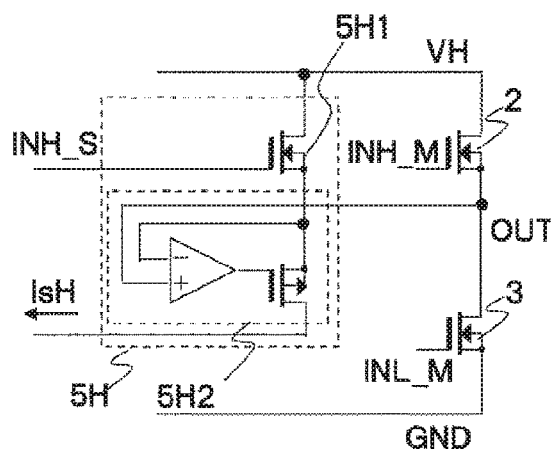
FIG. 2 is a block diagram illustrating an example of the configuration of a current detection circuit according to the first embodiment of the present invention.

FIG. 2 is a block diagram illustrating an example of the configuration of the current detection circuit 5H according to the first embodiment of the present invention. The current detection circuit 5H illustrated in FIG. 2 includes a high-side sense MOS 5H1, including an NMOS having the same process as the high-side switching element 3, to control on and off with INH_S, and a virtual short circuit 5H2, including an operational amplifier and a PMOS, for causing the voltages of the source terminal (OUT terminal) of the high-side switching element 3 and the source terminal of the sense MOS 5H1 to be at the same potential.

Figure 3:
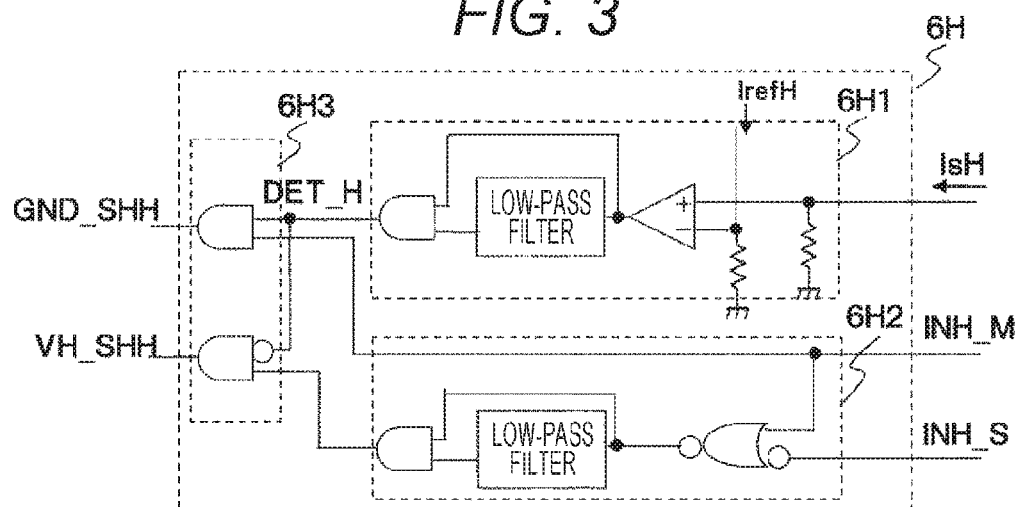
FIG. 3 is a block diagram illustrating an example of the configuration of a fault detection circuit according to the first embodiment of the present invention.

FIG. 3 is a block diagram illustrating an example of the configuration of the fault detection circuit 6H according to the first embodiment of the present invention. The fault detection circuit 6H illustrated in FIG. 3 is a circuit that detects fault states: a state where the OUT terminal is short-circuited to GND (hereinafter the ground fault); and a state where the OUT terminal is short-circuited to VH (hereinafter the power source fault). The fault detection circuit 6H includes a comparison circuit 6H1 that detects that the sense current IsH output by the current detection circuit 5H increases to or above a threshold current IrefH, a generation circuit 6H2 of a detection period Td, and a determination circuit 6H3 that determines the power source fault state, the ground fault state, and the normal state.

The comparison and detection circuit 6H1 includes a low-pass filter LPF1 with a time constant D1, the low-pass filter LPF1 being configured to remove the influence of noise and the like and output a DET_H signal. The generation circuit 6H2 of the detection period Td includes a low-pass filter LPF2 with a time constant D2.

Figure 4:
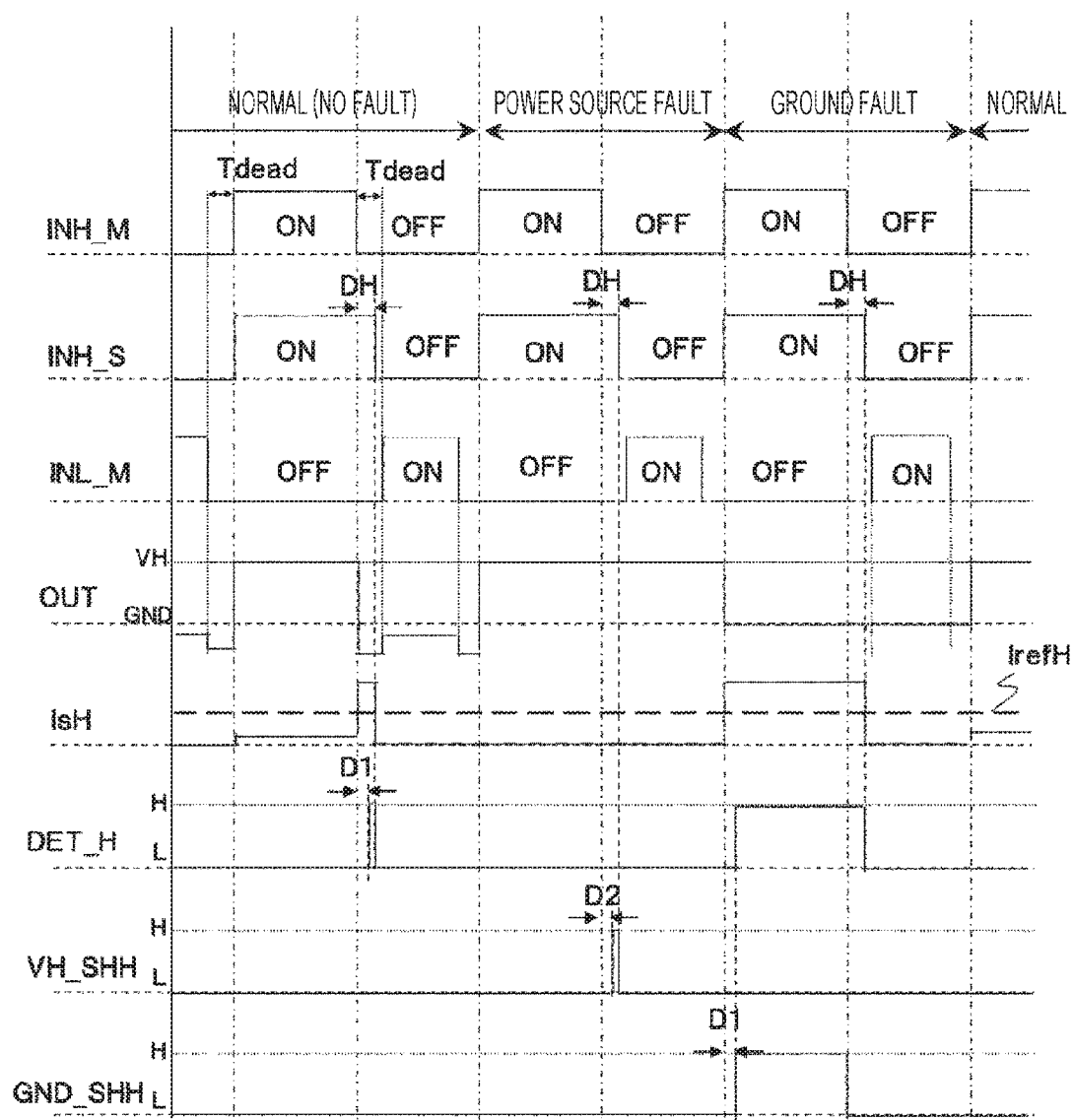
FIG. 4 is a timing chart illustrating an example of circuit operation according to the first embodiment of the present invention.

FIG. 4 is a timing chart explaining the operation of the load-driving circuit 1A according to the first embodiment of the present invention. The timing chart illustrated in FIG. 4 illustrates operations in three states—the power source fault, the ground fault, and a no-fault state (hereinafter the normal)—that can be detected in the embodiment in operation waveforms at contacts defined in FIGS. 1 to 3.

The gate signal INH_M of the high-side switching element 3 and the gate signal INL_M of the low-side switching element 4 are alternately and repeatedly turned on and off in periods other than a dead time period Tdead when they are simultaneously turned off. The gate signal INH_S of the high-side sense MOS 5H transitions from on to off delayed by a delay time DH after INH_M transitions from on to off. Hence, the detection period Td has a pulse for a period obtained by subtracting a delay D2 generated in the low-pass filter LPF2 from the period DH when INH_M=L and INH_S=H.

When the load-driving circuit 1A is in the normal state where there is no fault, the OUT terminal has a potential lower than GND due to a circulation current flowing through a body diode of the low-side switching element during the dead time period between when INH_M transitions to off and when INL_M transitions to on. When INH_S is on in the detection period Td, the sense current IsH equal to or more than the threshold IrefH is generated. A delay occurs by the time constant D1 of the low-pass filter LPF1, and then DET_H=H.

When the load-driving circuit 1A is in the power source fault state, the OUT terminal has a potential near VH even during a period when INH_M is off. The sense current IsH is not generated even if INH_S is on in the detection period Td. Accordingly, DET_H=L. In other words, when DET_H=L in the detection period Td, VH_SHH=H, and accordingly, the power source fault can be detected.

When the load-driving circuit 1A is in the ground fault state, the OUT terminal has a potential near GND even during a period when INH_M is on. At an instant when INH_M and INH_S transition from off to on, the high-side sense current IsH equal to or more than the threshold IrefH is generated. A delay occurs by the time constant D1 of the low-pass filter LPF1 although not the detection period Td, and then DET_H=H. In other words, when INH_M=H and DET_H=H, GND_SHH=H. The ground fault can be detected.

In terms of the timing chart of the present application, the fault states such as the normal, the power source fault, and the ground fault are descried in one timing chart. However, there is no temporal continuity in the fault states. They are independent of each other, and the detection result and the like of the previous fault state are not succeeded.

As described above, in the load-driving circuit 1A according to the embodiment, the gate signal INH_M of the high-side switching element 3 and the gate signal INH_S of the high-side sense MOS 5H1 are separated. INH_S is caused to stay on longer than INH_M. Accordingly, the power source fault, in addition to the ground fault, can also be detected. It is advantageous in improving the safety and reliability of the load-driving circuit.

Second Embodiment

Figure 5:
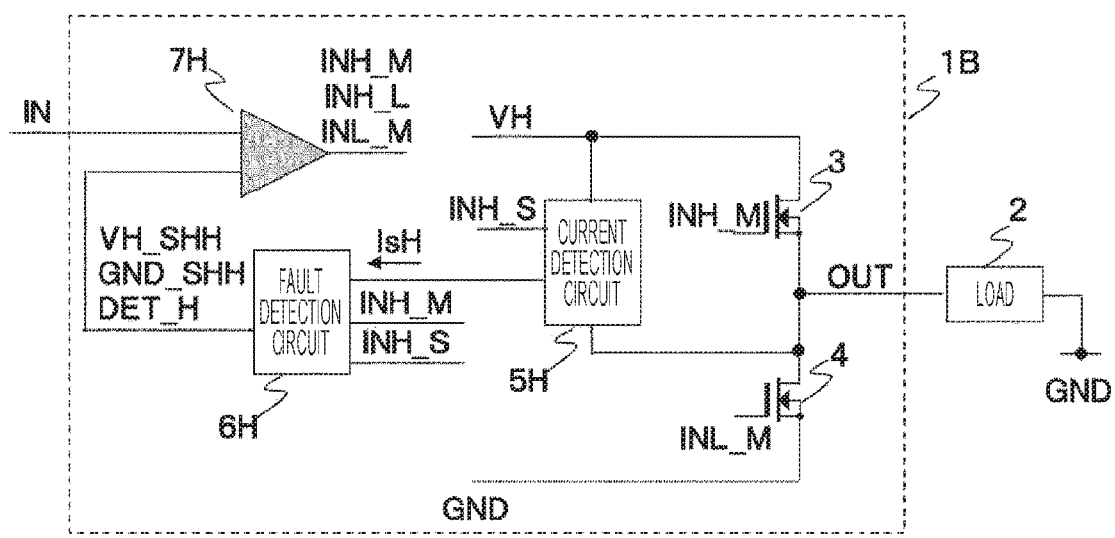
FIG. 5 is a block diagram illustrating an example of the configuration of a load-driving circuit according to a second embodiment of the present invention.

FIG. 5 is a block diagram illustrating the configuration of a load-driving circuit 1B and an electromagnetic load 2 according to a second embodiment. The load-driving circuit 1B illustrated in FIG. 5 includes, in addition to the load-driving circuit 1A illustrated in FIG. 1, a pre-driver circuit 7H that outputs the gate signal INH_M of the high-side switching element 3, the gate signal INH_S of the high-side sense MOS 5H1, and the gate signal INL_M of the low-side switching element 4 with outputs of the fault detection circuit 6H and a control signal IN of the load-driving circuit 1B as inputs. If there is no input signal from the fault detection circuit 6H, the pre-driver circuit 7H causes INH_M to transition from on to off when the IN signal transitions from H to L, causes INH_S to transition from on to off after the delay time DH, and causes INL_M to transition from off to on after the dead time period Tdead. Moreover, when the IN signal transitions from L to H, INL_M is transitioned from on to off, and INH_M and INH_S are transitioned from off to on after the dead time period Tdead.

Figure 6:
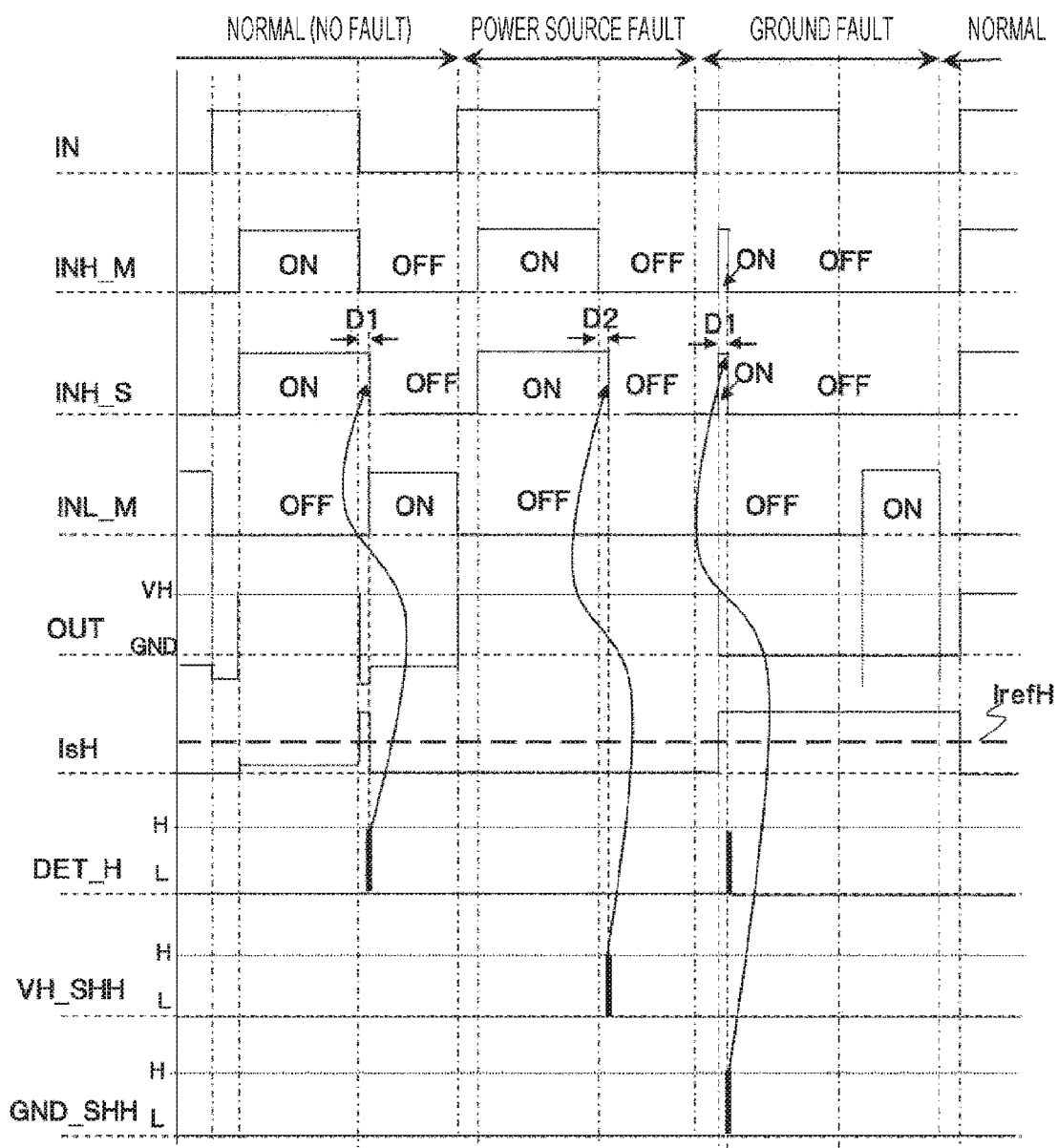
FIG. 6 is a timing chart illustrating an example of circuit operation according to the second embodiment of the present invention.

FIG. 6 is a timing chart explaining the operation of the load-driving circuit 1B according to the second embodiment of the present invention. In terms of the operations of output signals (DET_H, VH_SHH, and GND_SHH) of the fault detection circuit 6 in the normal, power source fault, and ground fault states, the timing chart illustrated in FIG. 6 is similar to that of FIG. 4. Accordingly, the operation and effect of the load-driving circuit 1B by the pre-driver 7 are described.

When the load-driving circuit 1B is normal, that is, when INH_M=L and INH_S=H, DET_H=H is detected. If VH_SHH=L and GND_SHH=L, it is determined to be the normal state. The pre-driver 7H causes INH_S to transition from on to off, and causes INL_M to transition from off to on. Consequently, the known dead time period Tdead can be reduced. During the dead time period, current flows through the body diode of the low-side switching element 4, and accordingly the amount of heat generated is increased. Accordingly, the reduction of the dead time period is advantageous in reducing the amount of heat generated in the load-driving circuit.

When the load-driving circuit 1B has the power source fault, that is, when the power source fault has been detected from VH_SHH=H, the pre-driver 7H fixes INL_M to off irrespective of the IN signal. Consequently, it is possible to prevent overcurrent that is generated by the turn-on of the low-side switching element. Accordingly, it is advantageous in improving the safety of the load-driving circuit 1B.

When the load-driving circuit 1B has the ground fault, that is, when the ground fault has been detected from GND_SHH=H, the pre-driver 7H causes INH_M and INH_S to transition to off irrespective of the IN signal. Accordingly, it is possible to prevent overcurrent that is generated by causing the high-side switching element to stay on. Accordingly, it is advantageous in improving the safety of the load-driving circuit 1B.

Third Embodiment

Figure 7:
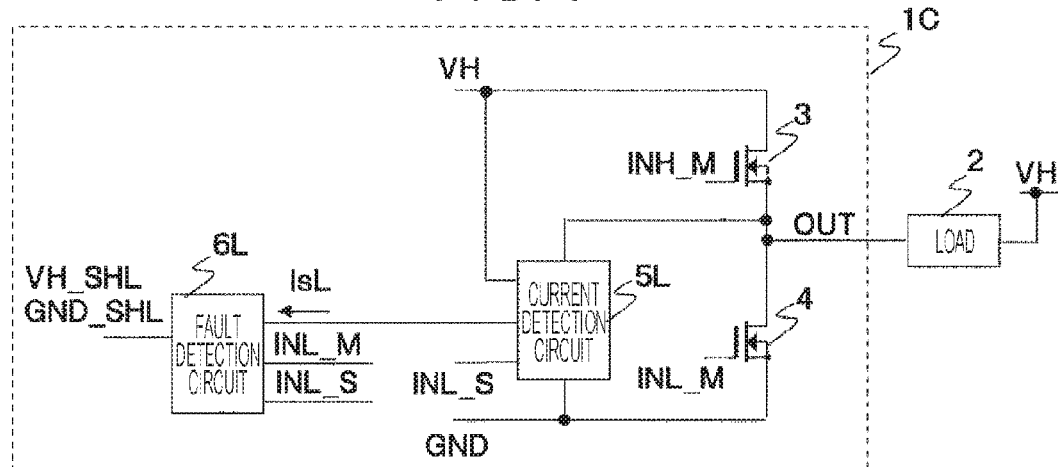
FIG. 7 is a block diagram illustrating a load-driving circuit according to a third embodiment of the present invention.

FIG. 7 is a block diagram illustrating the configuration of a load-driving circuit 1C and an electromagnetic load 2 according to a third embodiment of the present invention. The load-driving circuit 1C illustrated in FIG. 7 is connected at its terminal OUT to the electromagnetic load 2, and includes a low-side switching element 4 including an NMOS, receives the supply of power from a ground side GND of a direct current power source, and controls on and off with a gate signal INL_M, a high-side switching element 3 including an NMOS, receives the supply of power from a positive electrode side VH of the direct current power source, and controls on and off with a gate signal INH_M, a current detection circuit 5L connected in parallel to the low-side switching element 4 to output a sense current IsL proportional to the voltage between the drain and the source of the low-side switching element 4, and a fault detection circuit 6L that detects a fault state in the load-driving circuit 1C from the sense current IsL. Moreover, it is configured such that the electromagnetic load 2 is connected at its other terminal to VH (hereinafter the low-side driver configuration).

Figure 8:
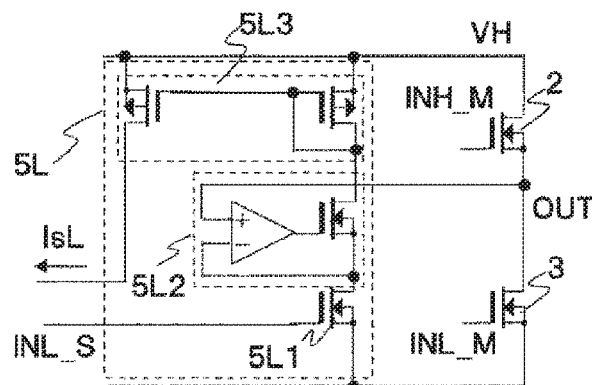
FIG. 8 is a block diagram illustrating an example of the configuration of a current detection circuit according to the third embodiment of the present invention.

FIG. 8 is a block diagram illustrating an example of the configuration of the current detection circuit 5L according to the third embodiment of the present invention. The current detection circuit 5L illustrated in FIG. 8 includes a low-side sense MOS 5L1 including an NMOS having the same process as the low-side switching element 4, and controls on and off with INL_S, a virtual short circuit 5L2, including an operational amplifier and an NMOS, for causing the voltages of the drain terminal (OUT terminal) of the low-side switching element 4 and the drain terminal of the low-side sense MOS 5L1 to be at the same potential, and a current mirror circuit 5L3 that turns back the current that has flown through the low-side sense MOS 5L1 and outputs IsL.

Figure 9:
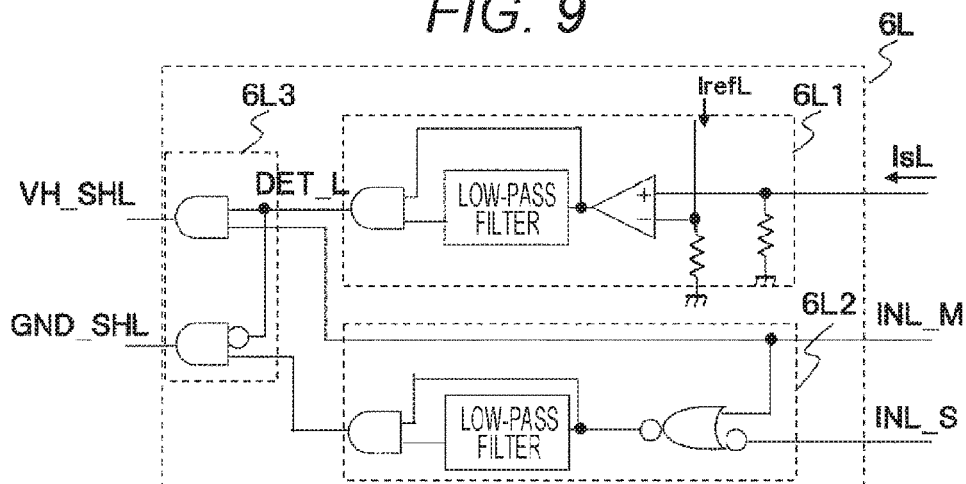
FIG. 9 is a block diagram illustrating an example of the configuration of a fault detection circuit according to the third embodiment of the present invention.

FIG. 9 is a block diagram illustrating an example of the configuration of the fault detection circuit 6L according to the third embodiment of the present invention. The fault detection circuit 6L illustrated in FIG. 9 is a circuit that detects fault states: a state where the OUT terminal is short-circuited to GND (hereinafter the ground fault); and a state where the OUT terminal is short-circuited to VH (hereinafter the power source fault). The fault detection circuit 6L includes a comparison circuit 6L1 that detects that the sense current IsL output by the current detection circuit 5L increases to or above a threshold IrefL, a generation circuit 6L2 of a detection period Td, and a determination circuit 6L3 that determines the power source fault state, the ground fault state, and the normal state.

The comparison and detection circuit 6L1 includes a low-pass filter LPF1 with a time constant D1, the low-pass filter LPF1 being configured to remove the influence of noise and the like and output a DET_L signal. The generation circuit 6L2 of the detection period Td includes a low-pass filer LPF2 with a time constant D2.

Figure 10:
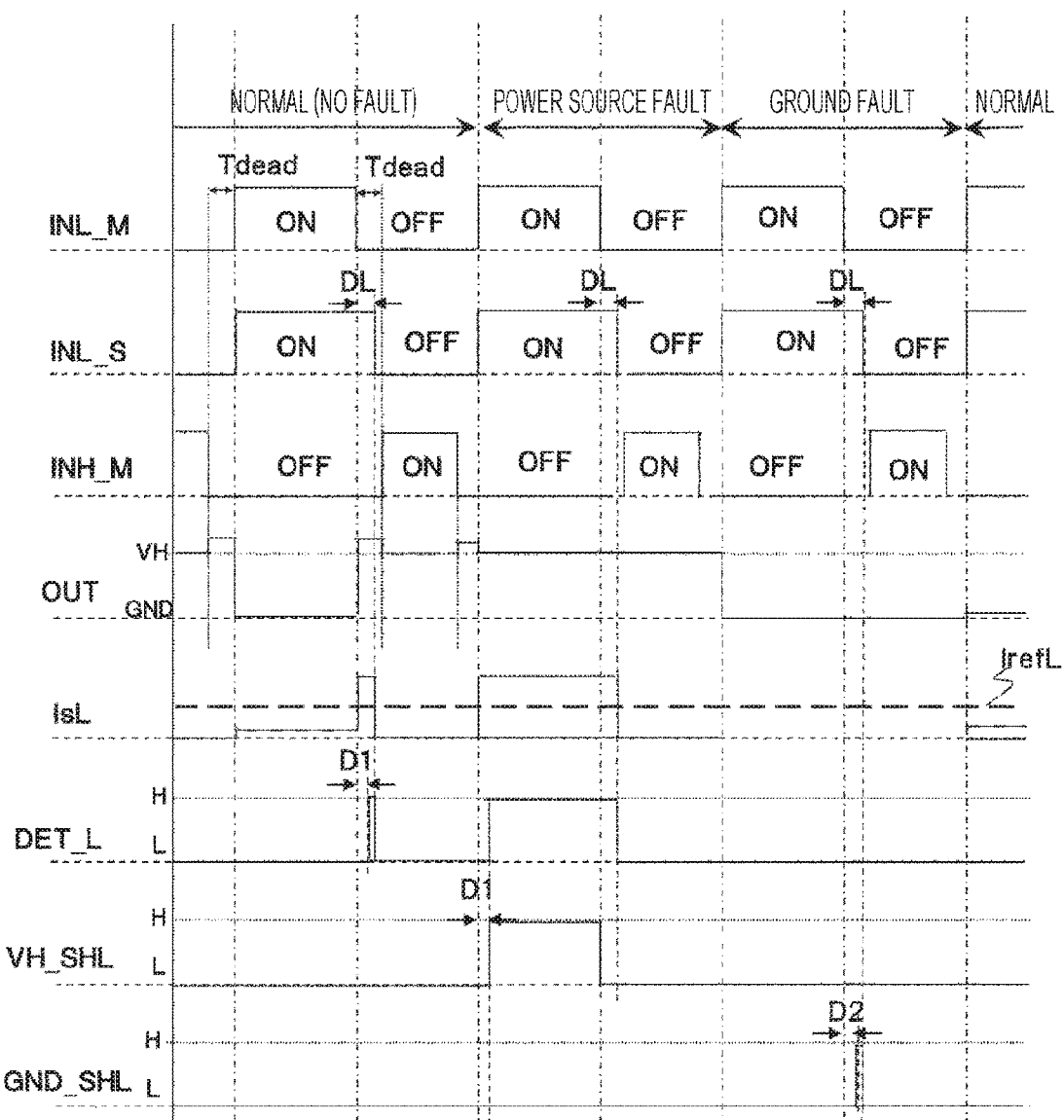
FIG. 10 is a timing chart illustrating an example of circuit operation according to the third embodiment of the present invention.

FIG. 10 is a timing chart explaining the operation of the load-driving circuit 1C according to the third embodiment of the present invention. The timing chart illustrated in FIG. 10 illustrates operations of three states—the power source fault, the ground fault, and a no-fault state (hereinafter the normal)—that can be detected in the embodiment in operation waveforms at contacts defined in FIGS. 7 to 9.

The gate signal INL_M of the low-side switching element 4 and the gate signal INH_M of the high-side switching element 3 are alternately and repeatedly turned on and off in periods other than a dead time period Tdead when they are simultaneously turned off. The gate signal INL_S of the low-side sense MOS 5L1 transitions from on to off delayed by a delay time DL after INL_M transitions from on to off. Hence, the detection period Td has a pulse for a period obtained by subtracting a delay D2 generated in the low-pass filter LPF2 from a period DL when INL_M=L and INL_S=H.

When the load-driving circuit 1C is in the normal state where there is no fault, the OUT terminal has a potential higher than VH due to a circulation current flowing through a body diode of the high-side switching element during the dead time period between when INL_M transitions to off and INH_M transitions to on. Accordingly, when INL_S is on in the detection period Td, the sense current IsL equal to or more than the threshold IrefL is generated. A delay occurs by the time constant D2 of the low-pass filter LPF2, and then DET_L=H.

When the load-driving circuit 1C is in the power source fault state, the OUT terminal has a potential near VH even during a period when INL_M is on. At an instant when INL_M and INL_S transition from off to on, the sense current IsL equal to or more than the threshold IrefL is generated. A delay occurs by the time constant D1 of the low-pass filter LPF1 although not the detection period Td, and then DET_L=H. In other words, when INL_M=H and DET_L=H, VH_SHL=H. Accordingly, the power source fault can be detected.

When the load-driving circuit 1C is in the ground fault state, the OUT terminal has the same potential as one near GND even during a period when INL_M is off. Even if INL_S is on in the detection period Td, the sense current IsL is not generated. Accordingly, DET_L=L. In other words, when DET_L=L in the detection period Td, then GND_SHL=H. Accordingly, the ground fault can be detected.

As described above, in the load-driving circuit 1C according to the embodiment, the gate signal INL_M of the low-side switching element and the gate signal INL_S of the low-side sense MOS are separated. INL_S is caused to stay on longer than INL_M. Accordingly, the ground fault, in addition to the power source fault, can also be detected. It is advantageous in improving the safety and reliability of the load-driving circuit.

Fourth Embodiment

Figure 11:
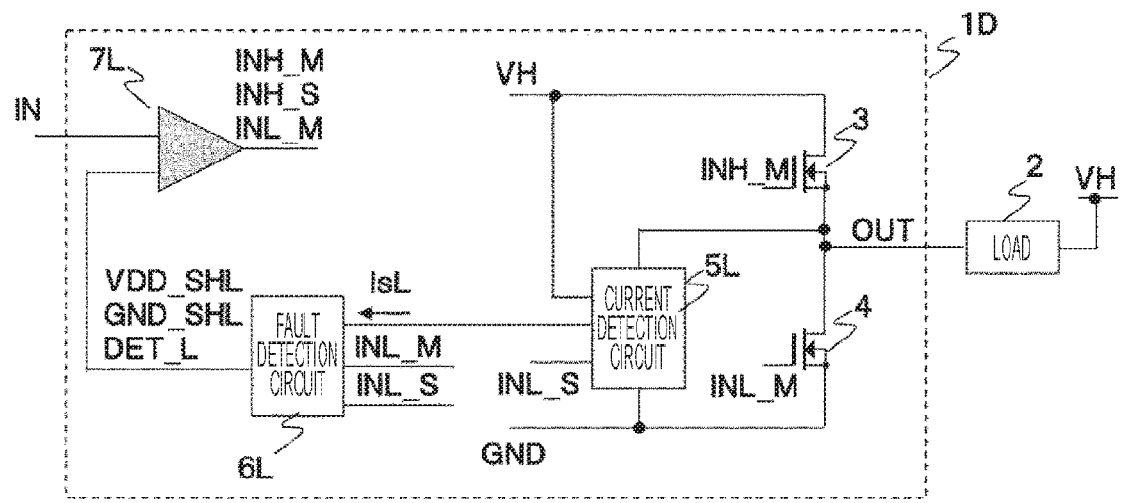
FIG. 11 is a block diagram illustrating an example of the configuration of a load-driving circuit according to a fourth embodiment of the present invention.

FIG. 11 is a block diagram illustrating the configuration of a load-driving circuit 1D and an electromagnetic load 2 according to a fourth embodiment of the present invention. The load-driving circuit 1D illustrated in FIG. 11 includes, in addition to the load-driving circuit 1C illustrated in FIG. 7, a pre-driver circuit 7L that outputs the gate signal INL_M of the low-side switching element 4, the gate signal INL_S of the low-side sense MOS 5L1, and the gate signal INH_M of the high-side switching element 3, with the outputs of the fault detection circuit 6L and a control signal IN of the load-driving circuit 1D as inputs. If there is no input signal from the fault detection circuit 6L, the pre-driver circuit 7L causes INL_M to transition from on to off when the IN signal transitions from H to L, causes INL_S from on to off after the delay time DL, and causes INH_M to transition from off to on after the dead time period Tdead. Moreover, INH_M is transitioned from on to off when the IN signal transitions from L to H, and INL_M and INL_S are transitioned from off to on after the dead time period Tdead.

Figure 12:
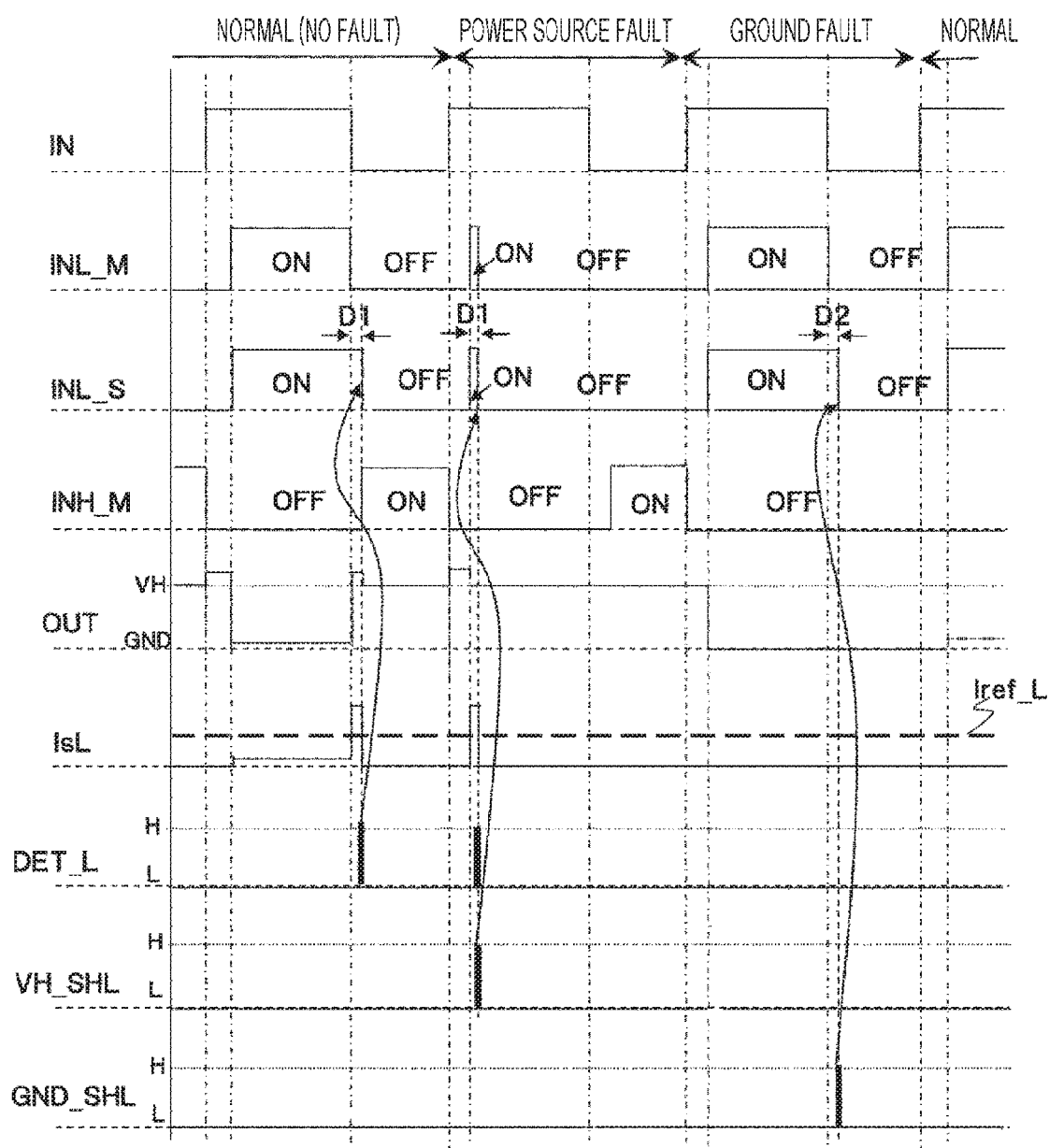
FIG. 12 is a timing chart illustrating an example of circuit operation according to the fourth embodiment of the present invention.

FIG. 12 is a timing chart explaining the operation of the load-driving circuit 1D according to the fourth embodiment of the present invention. In terms of the operations of the output signals (DET_L, VH_SHL, and GND_SHL) of the fault detection circuit 6L in the normal, power source, and ground fault states, the timing chart illustrated in FIG. 12 is similar to that of FIG. 10. Accordingly, the operation and effect of the load-driving circuit 1D by the pre-driver 7L are described.

When the load driver circuit 1D is normal, that is, when INL_M=L and INL_S=H, DET_L=H is detected. If GND_SHL=L and VH_SHL=L, it is determined to be the normal state. INL_S is transitioned from on to off, and INH_M from off to on. Consequently, the known dead time period Tdead can be reduced. During the dead time period, current flows through the body diode of the high-side switching element 3, and accordingly the amount of heat generated is increased. Accordingly, the reduction of the dead time period is advantageous in reducing the amount of heat generated in the load-driving circuit.

When the load-driving circuit 1D has the ground fault, that is, when the fault detection circuit 6L has detected the ground fault from GND_SHL=H, the pre-driver 7L fixes INH_M and INH_S to off irrespective of the IN signal, and accordingly it is possible to prevent overcurrent that is generated by the turn-on of the high-side switching element. Consequently, it is advantageous in improving the safety of the load-driving circuit 1D.

When the load-driving circuit 1D has the power source fault, that is, when the fault detection circuit 6L has detected the power source fault from VH_SHL=H, the pre-driver 7L causes INL_M and INL_S to transition to off irrespective of the IN signal, and accordingly, it is possible to prevent overcurrent that is generated by causing the low-side switching element to stay on. Consequently, it is advantageous in improving the safety of the load-driving circuit 1D.

Fifth Embodiment

Figure 13:
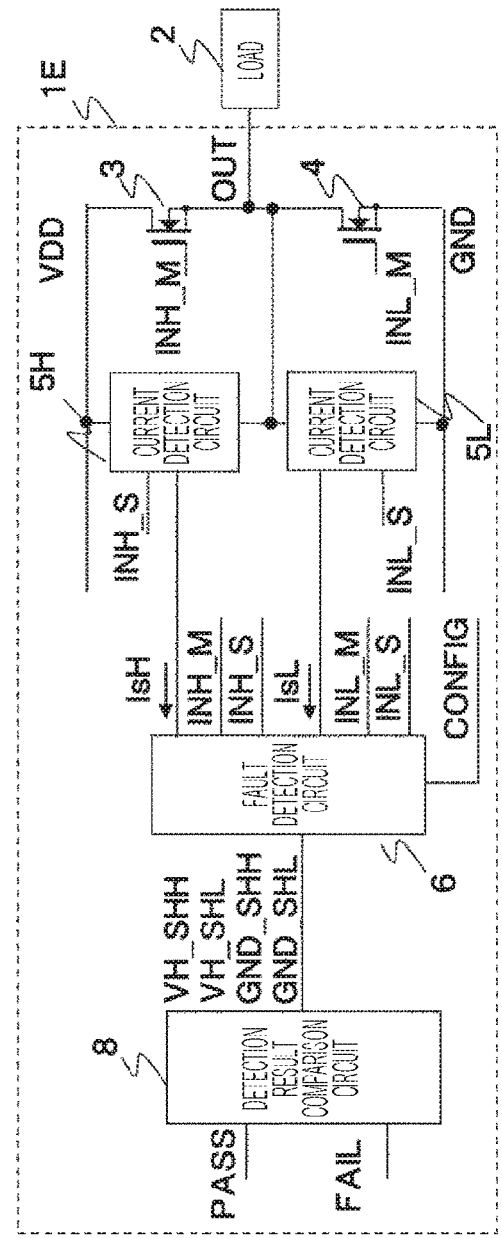
FIG. 13 is a block diagram illustrating an example of the configuration of a load-driving circuit according to a fifth embodiment of the present invention.

FIG. 13 is a block diagram illustrating the configuration of a load-driving circuit 1E and an electromagnetic load 2 according to a fifth embodiment of the present invention. The load-driving circuit 1E illustrated in FIG. 13 is connected at its OUT terminal to the electromagnetic load 2, and includes a high-side switching element 3 including an NMOS, receives the supply of power from a positive electrode side VH of a direct current power source, and controls on and off with a gate signal INH_M, a low-side switching element 4 including an NMOS, receives the supply of power from a ground side GND of the direct current power source, and controls on and off with a gate signal INL_M, a current detection circuit 5H connected in parallel to the high-side switching element 3 to output a sense current IsH proportional to the voltage between the drain and the source of the high-side switching element 3, a current detection circuit 5L connected in parallel to the low-side switching element 4 to output a sense current IsL proportional to the voltage between the drain and the source of the low-side switching element 4, and a fault detection circuit 6 that detects a fault state of the load-driving circuit 1E from the high-side sense current IsH and the low-side sense current IsL.

Moreover, it is configured to be capable of selecting, with a CONFIG signal, a low-side driver configuration where the other terminal of the electromagnetic load 2 is connected to VH and a high-side driver configuration where the other terminal of the electromagnetic load 2 is connected to GND.

Moreover, the high-side current detection circuit 5H and the low-side current detection circuit 5L of FIG. 13 have the same configurations and operations as the high-side current detection circuit 5H of FIG. 2 and the low-side current detection circuit 5L of FIG. 8.

Figure 14:
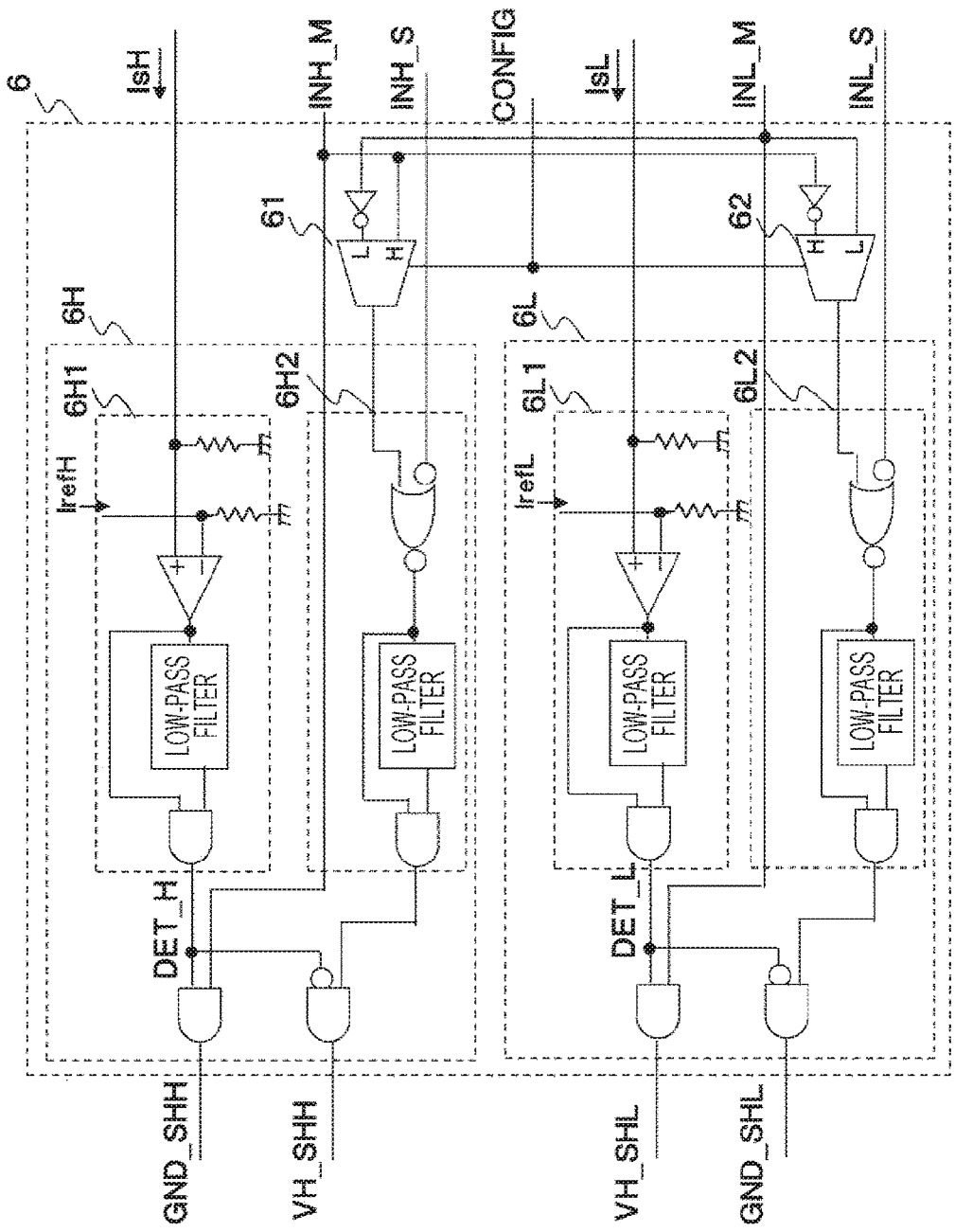
FIG. 14 is a block diagram illustrating an example of the configuration of a fault detection circuit according to the fifth embodiment of the present invention.

In FIG. 14, it is a block diagram illustrating an example of the configuration of the fault detection circuit 6 according to the fifth embodiment of the present invention. The fault detection circuit 6 illustrated in FIG. 14 includes the high-side fault detection circuit 6H of FIG. 3, the low-side fault detection circuit 6L of FIG. 9, a selector 61 that switches the input of a detection period Td generation circuit 6H2 of the high-side fault detection circuit 6H with the CONFIG signal, and a selector 62 that switches the input of a detection period Td generation circuit 6L2 of the low-side fault detection circuit 6L with the CONFIG signal. The CONFIG signal is an apparatus that controls the load-driving circuit 1E. In order to set CONFIG=H in a case of the high-side driver configuration, and set CONFIG=L in a case of the low-side driver configuration, signals of H terminals of the selectors 61 and 62 are selected when CONGIF=H, and signals of L terminals of the selectors 61 and 62 are selected when CONFIG=L.

Figure 15:
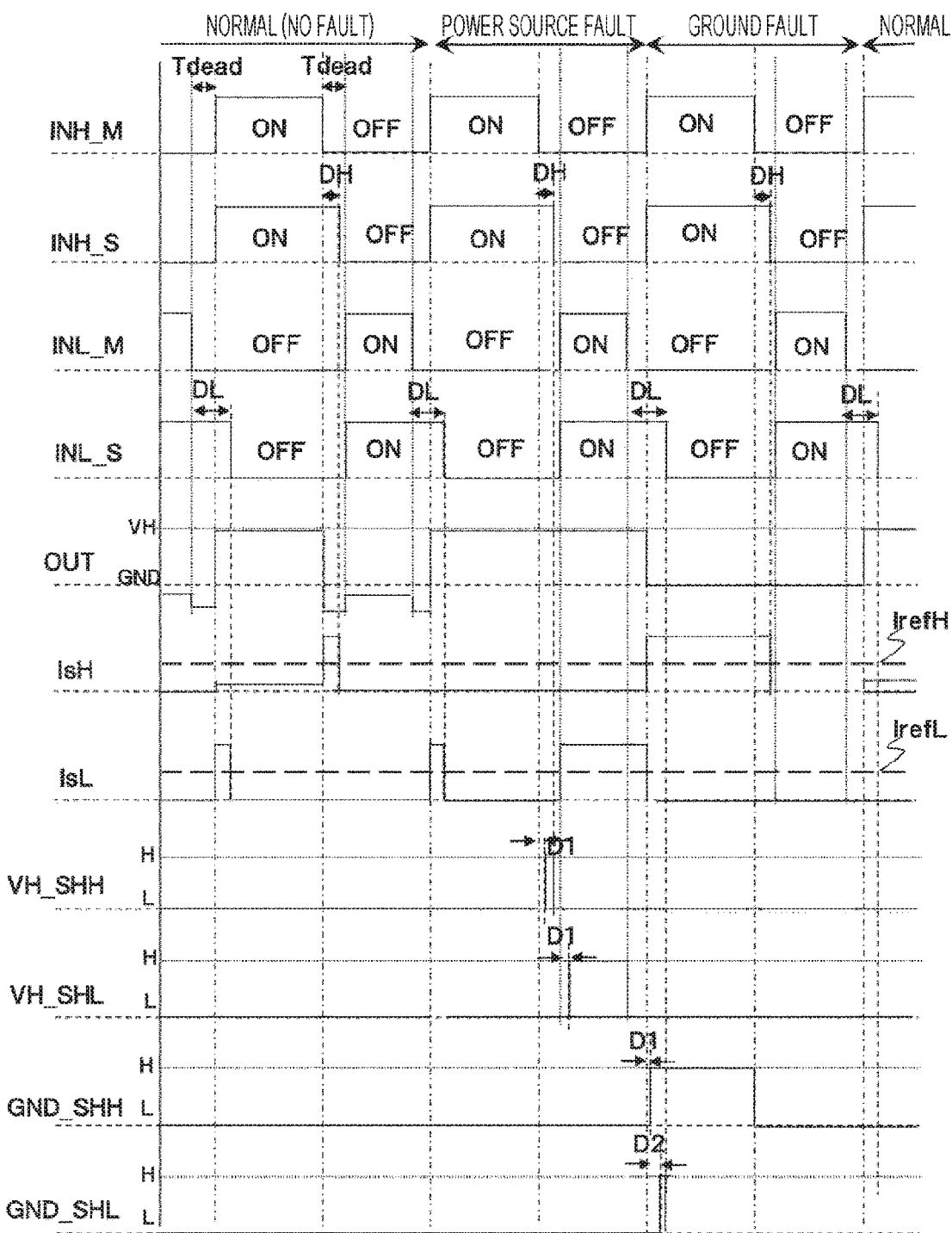
FIG. 15 is a timing chart illustrating an example of the circuit operation of a high-side driver configuration according to the fifth embodiment of the present invention.

FIG. 15 illustrates an example of a timing chart of the high-side driver configuration according to the fifth embodiment of the present invention. CONFIG=H is set since it is the high-side driver configuration.

The operation of the high-side fault detection circuit 6H of the fault detection circuit 6 of the load-driving circuit 1E is the same as that of FIG. 4 of the first embodiment. Accordingly, the operation of the low-side fault detection circuit 6L is described.

When the load-driving circuit 1E is in the normal state where there is no fault in the high-side driver configuration, INL_M transitions from on to off, and INH_M and INH_S subsequently transition from off to on after a dead time period Tdead. INL_S transitions from on to off after a delay time DL. In a detection period Td of the low-side fault detection circuit 6L when INH_M is on and INL_M is off, the OUT terminal has a potential near VH. Accordingly, the high-side sense current IsH is equal to or more than a threshold current IrefH when INH_S is on. However, the low-side sense current IsL becomes equal to or more than a threshold current IrefL when INL_S is on. Accordingly, a delay occurs by the time constant D1 of the LPF1, and then DET_L=H.

When the load-driving circuit 1E is in the power source fault state, the OUT terminal has a potential near VH. As in the normal state, in the detection period Td of the low-side fault detection circuit 6L, the high-side sense current IsH is equal to or less than the threshold current IrefH, but the low-side sense current IsL becomes equal to or more than the threshold current IrefL. Accordingly, a delay occurs by the time constant D1 of the LPF1, and then DET_L=H. Accordingly, the fault cannot be detected. However, at an instant when INL_M and INL_S transition from off to on after the dead time period Tdead after INH_M transitions from on to off, a current equal to or more than the threshold IrefL is generated in terms of the low-side sense current IsL. After a delay by the time constant D1 of the low-pass filter LPF1, DET_L=H although not the detection period Td. In other words, when INL_M=H and DET_L=H, VH_SHL=H. Therefore, the power source fault can be detected.

When the load-driving circuit 1E is in the ground fault state, the OUT terminal has a potential near GND. Even if INL_S is turned on in the detection period Td, the sense current IsL is not generated. Accordingly, DET_L=L. In other words, when DET_L=L in the detection period Td, GND_SHL=H. Therefore, the ground fault can be detected.

Figure 16:
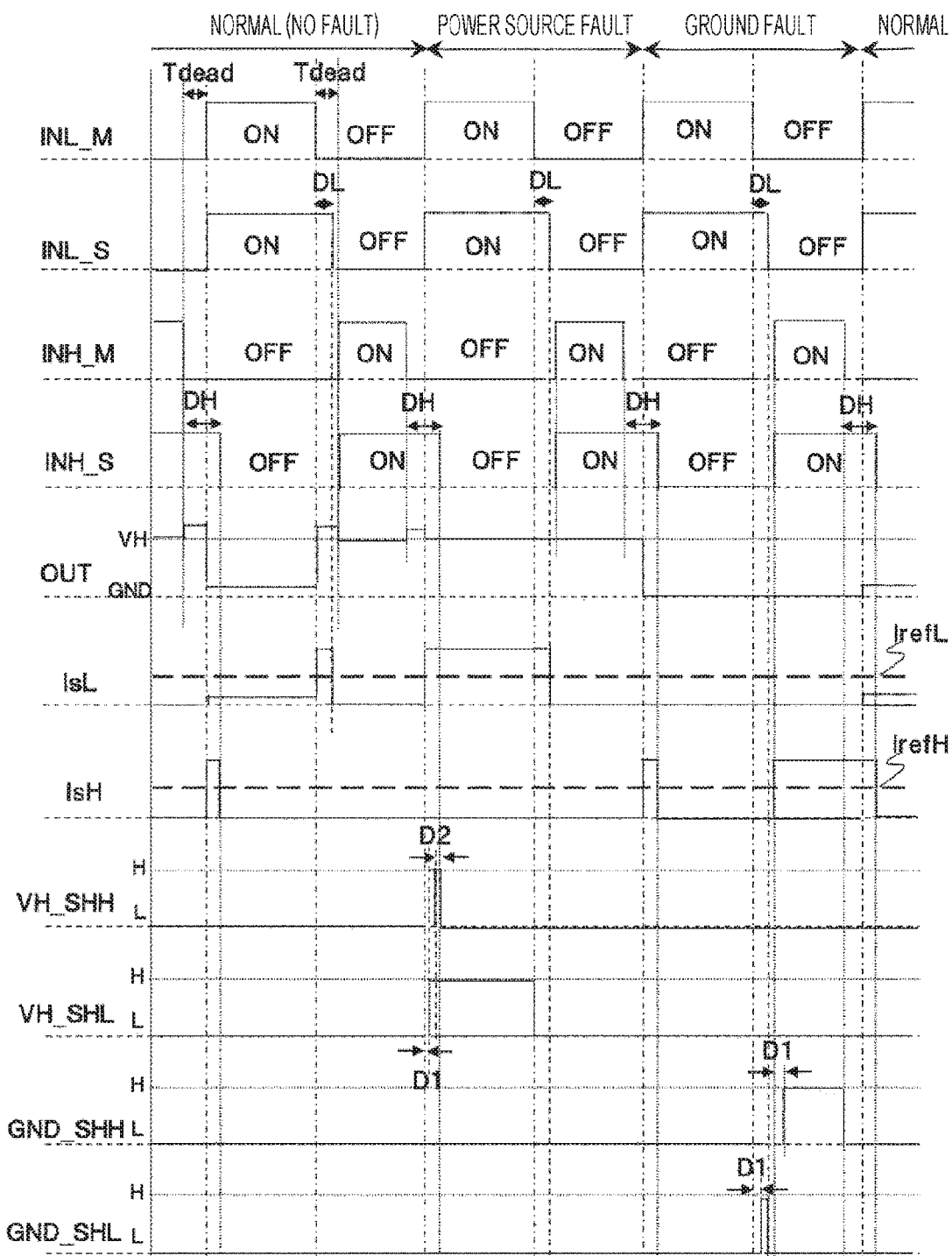
FIG. 16 is a timing chart illustrating an example of the circuit operation of a low-side driver configuration according to the fifth embodiment of the present invention.

FIG. 16 illustrates an example of a timing chart of the low-side driver configuration according to the fifth embodiment of the present invention. CONFIG=L is set since it is the low-side driver configuration.

The operation of the low-side fault detection circuit 6L of the fault detection circuit 6 of the load-driving circuit 1E is the same as that of FIG. 10 of the first embodiment. Accordingly, the operation of the high-side fault detection circuit 6H is described.

When the load-driving circuit 1E is in the normal state where there is no fault in the low-side driver configuration, INH_M transitions from on to off. INL_M and INL_S subsequently transition from off to on in the dead time period Tdead. INH_S transitions from on to off after the delay time DH. In the detection period Td of the high-side fault detection circuit 6H when INH_M is off and INL_M is on, the OUT terminal has a potential near GND. Accordingly, the low-side sense current IsL is equal to or less than the threshold current IrefL when INL_S is on, but the high-side sense current IsH becomes equal to or more than the threshold current IrefH when INH_S is on. Accordingly, a delay occurs by the time constant D1 of the LPF1, and then DET_H=H.

When the load-driving circuit 1E is in the ground fault state, the OUT terminal has a potential near GND. As in the normal state, in the detection period Td of the high-side fault detection circuit 6H, the low-side sense current IsL is equal to or less than the threshold current IrefL, but the high-side sense current IsH becomes equal to or more than the threshold current IrefH. Accordingly, a delay occurs by the time constant D1 of the LPF1, and then DET_H=H. Accordingly, the fault cannot be detected. However, at an instant when INH_M and INH_S transition from off to on after the dead time period Tdead after INL_M transitions from on to off, a current equal to or more than the threshold IrefH is generated in terms of the high-side sense current IsH. After a delay by the time constant D1 of the low-pass filter LPF1, DET_H=H although not the detection period Td. In other words, when INH_M=H and DET_H=H, GND_SHH=H. Accordingly, the ground fault can be detected.

When the load-driving circuit 1E is in the power source fault state, the OUT terminal has a potential near VH. Even if INH_S is on in the detection period Td, the sense current IsH is not generated. Accordingly, DET_H=L. In other words, when DET_H=L in the detection period Td, then VH_SHH=H. Accordingly, the ground fault can be detected.

As described above, in the load-driving circuit 1E according to the embodiment, the high-side fault detection circuit 6H and the low-side fault detection circuit 6L are used to enable the detection of both of the power source fault and the ground fault. Hence, an anomaly in the fault detection circuit can be detected by the comparison of the mutual fault detection results, which is advantageous in further improving the reliability of the load-driving circuit 1E. Moreover, the high-side driver configuration and the low-side driver configuration are switched by the CONFIG signal. Accordingly, a fault can be detected not based on the power source connected to the electromagnetic load 2. Accordingly, it is advantageous in making the load-driving circuit 1E flexible.

Sixth Embodiment

Figure 17:
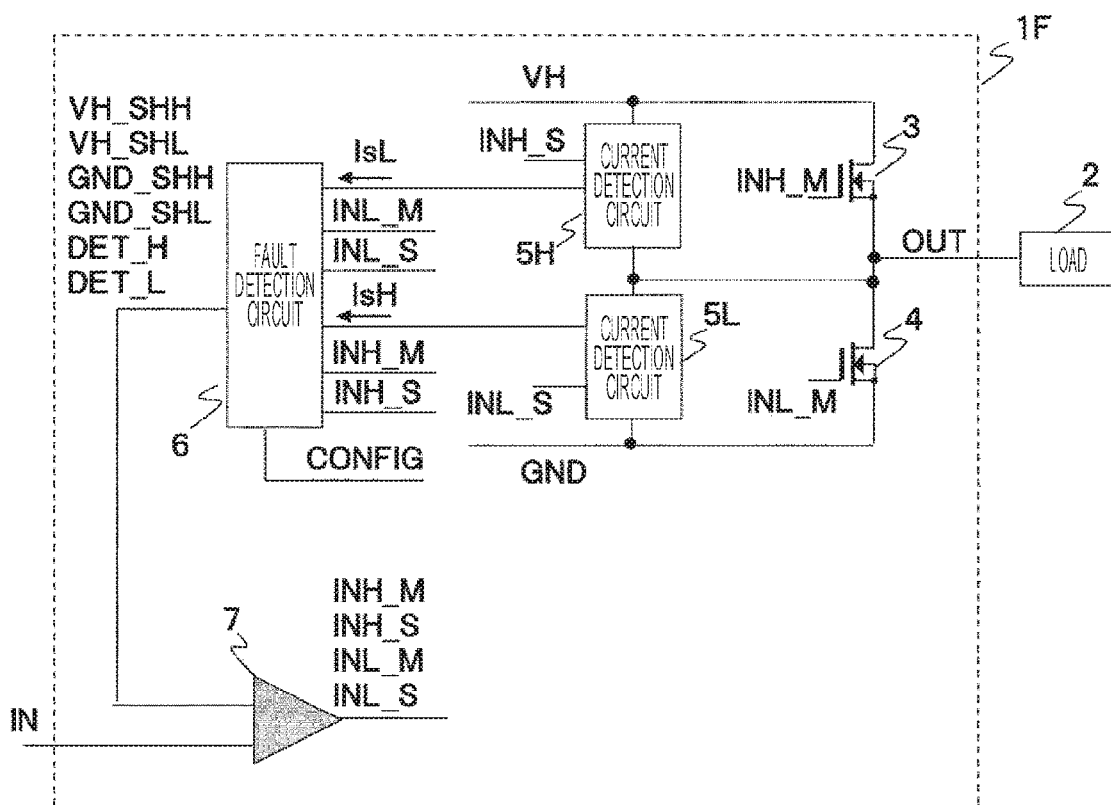
FIG. 17 is a block diagram illustrating an example of the configuration of a load-driving circuit according to a sixth embodiment of the present invention.

In FIG. 17, it is a block diagram illustrating the configuration of a load-driving circuit 1F and an electromagnetic load 2 according to a sixth embodiment of the present invention. The load-driving circuit 1F illustrated in FIG. 17 includes, in addition to the load-driving circuit 1E illustrated in FIG. 13, a pre-driver circuit 7 that outputs the gate signal INH_M of the high-side switching element 3, the gate signal INH_S of the high-side sense MOS 5H1, the gate signal INL_M of the low-side switching element 4, and the gate signal INL_S of the low-side sense MOS 5L1, with the outputs of the fault detection circuit 6, a control signal IN of the load-driving circuit 1F, and a driver constituent signal CONFIG as inputs.

If there is no input signal from the fault detection circuit 6 in a case of the high-side driver configuration, the pre-driver circuit 7 causes INH_M from on to off when the IN signal transitions from H to L, causes INH_S to transition from on to off after the delay DH, and causes INL_M and INL_S to transition from off to on after the dead time period Tdead. Moreover, INL_M is transitioned from on to off when the IN signal transitions from L to H. INH_M and INH_S are transitioned from off to on after the dead time period Tdead. INL_S is transitioned from on to off after the delay DL.

If there is no input signal from the fault detection circuit 6 in a case of the low-side driver configuration, INL_M is transitioned from on to off when the IN signal transitions from H to L. INL_S is transitioned from on to off after the delay DL. INH_M and INH_S are transitioned from off to on after the dead time period Tdead. Moreover, INH_M is transitioned from on to off when the IN signal transitions from L to H. INL_M and INL_S are transitioned from off to on after the dead time period Tdead. INH_S is transitioned from on to off after the delay DH.

Figure 18:
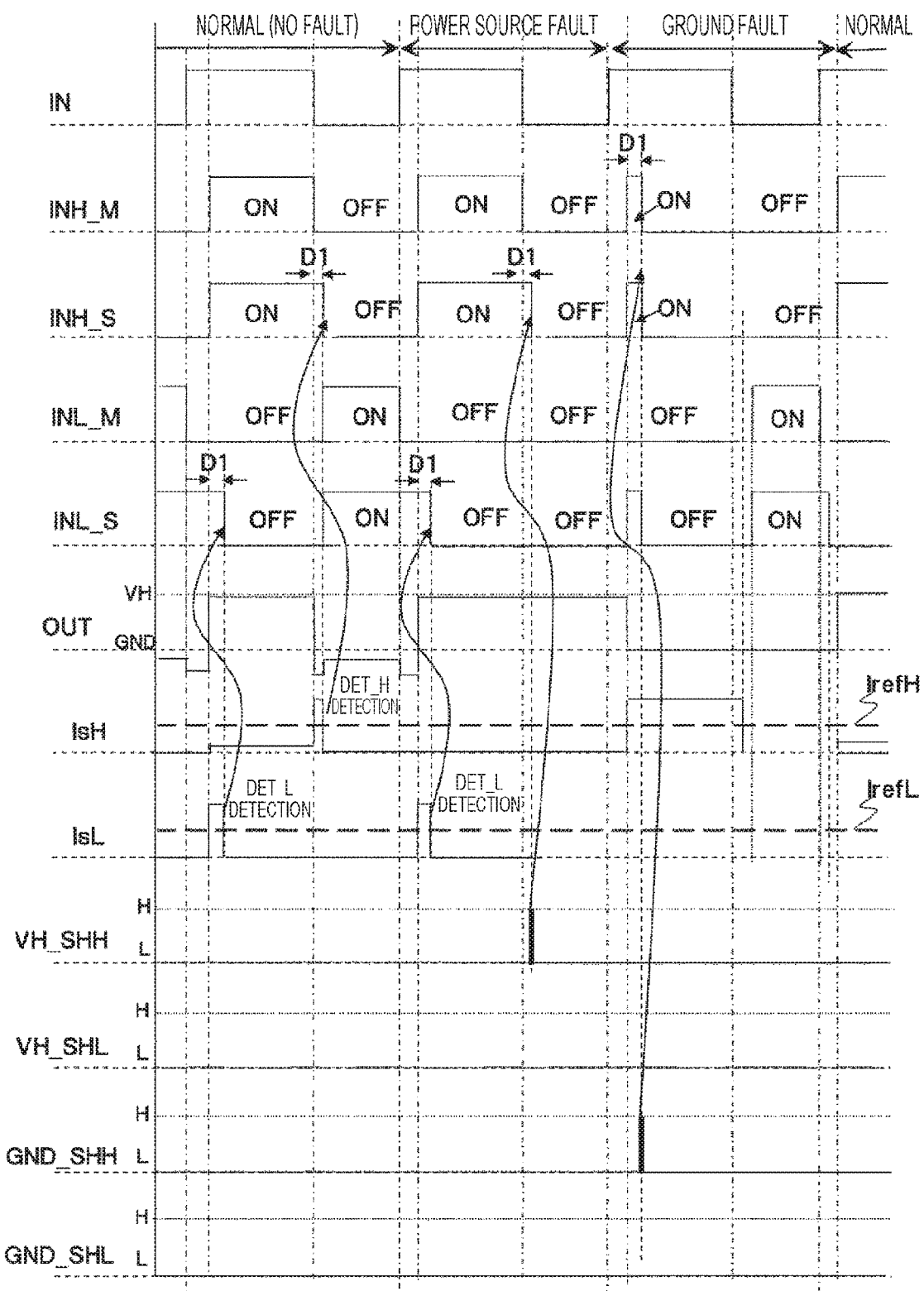
FIG. 18 is a timing chart illustrating an example of the circuit operation of a high-side driver configuration according to the sixth embodiment of the present invention.

FIG. 18 illustrates an example of a timing chart explaining the operation of the load-driving circuit 1F of the high-side driver configuration according to the sixth embodiment of the present invention. The timing chart illustrated in FIG. 18 is similar to that of FIG. 15 in terms of the operation of the fault detection circuit 6 in the normal, power source fault, and ground fault states. Accordingly, the operation and effect of the load-driving circuit 1F by the pre-driver 7 are described.

When the load-driving circuit 1F is in the normal state, it is determined to be the normal state if DET_L=H is detected in the detection period Td after the input signal IN transitions from low to high, and if GND_SHH=L, GND_SHL=L, VH_SHH=L, and VH_SHL=L. INL_S is then transitioned from on to off. It is determined to be the normal state if DET_H=H is detected in the detection period Td after the input signal IN transitions from high to low, and if GND_SHH=L, GND_SHL=L, VH_SHH=L, and VH_SHL=L. INH_S is then transitioned from on to off, and INL_M and INL_S from off to on. Accordingly, the known dead time period Tdead can be reduced. In the dead time period, current flows through a body diode of the low-side switching element 4. Accordingly, the amount of heat generated is increased. Hence, the reduction of the dead time period is advantageous in reducing the amount of heat generated in the load-driving circuit.

When the load-driving circuit 1F is in the power source fault state, and the fault detection circuit 6 has detected the power source fault from VH_SHH=H, the pre-driver 7 fixes INL_M and INL_S to off irrespective of the IN signal. Accordingly, it is possible to prevent overcurrent that is generated by the turn-on of the low-side switching element. Accordingly, it is advantageous in improving the safety of the load-driving circuit 1F.

When the load-driving circuit 1F is in the ground fault state, and the fault detection circuit 6 has detected the ground fault from GND_SHH=H, the pre-driver 7 causes INH_M and INH_S to transition to off irrespective of the IN signal. Accordingly, it is possible to prevent overcurrent that is generated by causing the high-side switching element to stay on. Accordingly, it is advantageous in improving the safety of the load-driving circuit 1F.

Figure 19:
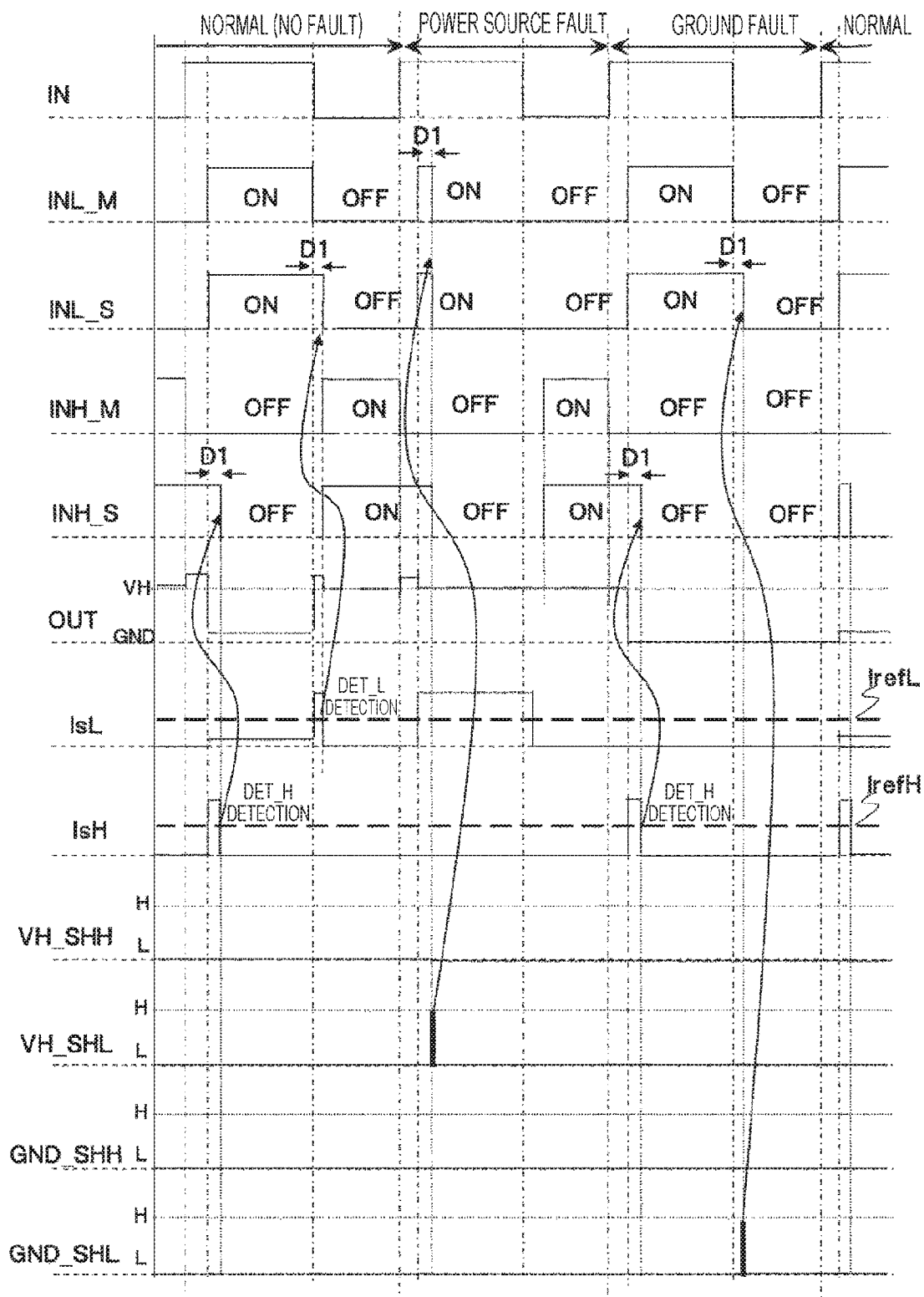
FIG. 19 is a timing chart illustrating an example of the circuit operation of a low-side driver configuration according to the sixth embodiment of the present invention.

FIG. 19 illustrates an example of a timing chart of the low-side driver configuration according to the sixth embodiment of the present invention. The timing chart illustrated in FIG. 19 is similar to that of FIG. 16 in terms of the operation of the fault detection circuit 6 in the normal, power source fault, and ground fault states. Accordingly, the operation and effect of the load-driving circuit 1F by the pre-driver 7 are described.

When the load-driving circuit 1F is in the normal state, it is determined to be the normal state if DET_H=H is detected in the detection period Td after the input signal IN transitions from low to high, and if GND_SHH=L, GND_SHL=L, VH_SHH=L, and VH_SHL=L. INH_S is then transitioned from on to off. It is determined to be the normal state if DET_L=H is detected in the detection period Td after the input signal IN transitions from high to low, and if GND_SHH=L, GND_SHL=L, VH_SHH=L, and VH_SHL=L. INL_S is then transitioned from on to off, and INH_M and INH_S from off to on. Accordingly, the known dead time period Tdead can be reduced. In the dead time period, current flows through a body diode of the high-side switching element 3. Accordingly, the amount of heat generated increases. Hence, the reduction of the dead time period is advantageous in reducing the amount of heat generated in the load-driving circuit.

When the load-driving circuit 1F is in the ground fault state, and the fault detection circuit 6 has detected the ground fault from GND_SHL=H, the pre-driver 7 fixes INH_M and INH_S to off irrespective of the IN signal. Accordingly, it is possible to prevent overcurrent that is generated by the turn-on of the high-side switching element. Accordingly, it is advantageous in improving the safety of the load-driving circuit 1F.

When the load-driving circuit 1F is in the power source fault state and the fault detection circuit 6 has detected the power source fault from VH_SHL=H, the pre-driver 7 causes INL_M and INL_S to transition to off irrespective of the IN signal. Accordingly, it is possible to prevent overcurrent that is generated by causing the low-side switching element to stay on. Accordingly, it is advantageous in improving the safety of the load-driving circuit 1F.

Seventh Embodiment

Figure 20:
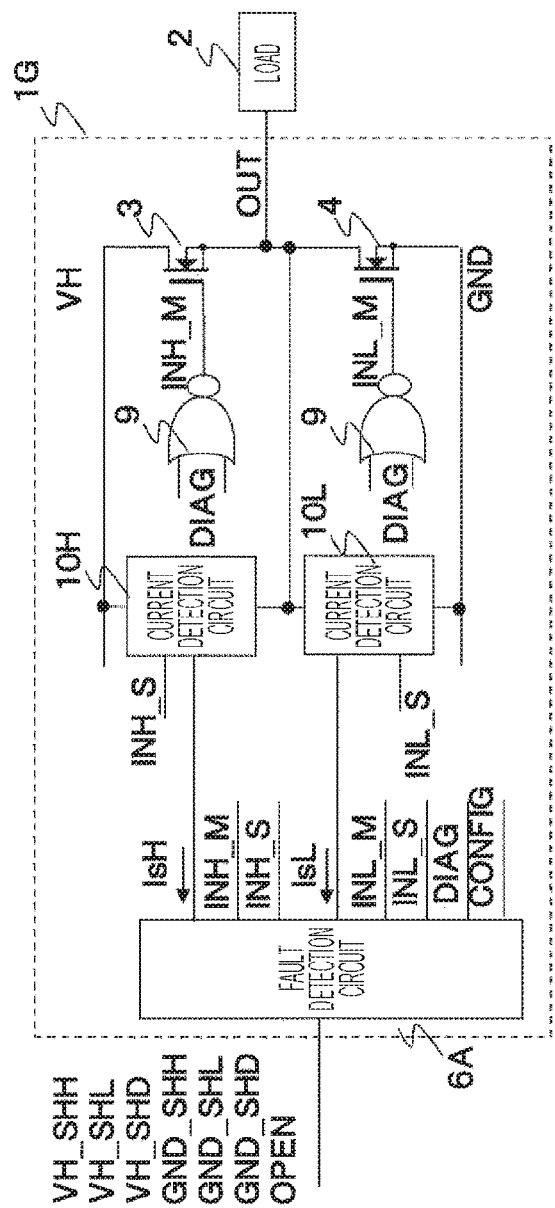
FIG. 20 is a block diagram illustrating an example of the configuration of a load-driving circuit according to a seventh embodiment of the present invention.

In FIG. 20, it is a block diagram illustrating the configuration of a load-driving circuit 1G and an electromagnetic load 2 according to a seventh embodiment of the present invention.

The load-driving circuit 1G illustrated in FIG. 20 is connected at its OUT terminal to the electromagnetic load 2, and includes a high-side switching element 3 including an NMOS, receives the supply of power from a positive electrode side VH of a direct current power source, and controls on and off with a gate signal INH_M, a low-side switching element 4 including an NMOS, receives the supply of power from a ground side GND of the direct current power source, and controls on and off with a gate signal INL_M, a current detection circuit 10H connected in parallel to the high-side switching element 3 to output a sense current IsH proportional to the voltage between the drain and the source of the high-side switching element 3, a current detection circuit 10L connected in parallel to the low-side switching element 4 to output a sense current IsL proportional to the voltage between the drain and the source of the high-side switching element 4, a fault detection circuit 6A that detects a fault state of the load-driving circuit 1G from the high-side sense current IsH and the low-side sense current IsL, and logic circuits 9 that receive a DIAG signal that outputs H during a diagnosis period set at a given timing within a period when the load-driving circuit 1G does not drive the load, and fix the gate signal INH_M of the high-side switching element 3 and the gate signal INL_M of the low-side switching element 4 to off.

Moreover, it is configured to be capable of selecting, with a CONFIG signal, a low-side driver configuration where the other terminal of the electromagnetic load 2 is connected to VH and a high-side driver configuration where the other terminal of the electromagnetic load 2 is connected to GND.

Figure 21:
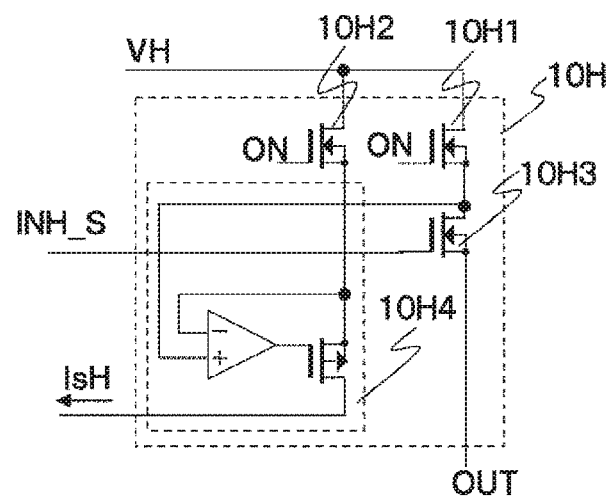
FIG. 21 is a block diagram illustrating an example of the configuration of a high-side current detection circuit according to the seventh embodiment of the present invention.

In FIG. 21, it is a block diagram illustrating an example of the configuration of the high-side current detection circuit 10H according to the seventh embodiment of the present invention.

The high-side current detection circuit 10H illustrated in FIG. 21 includes a first high-side sense MOS 10H1 including an NMOS having the same process as the high-side switching element 3, and is always on, a second high-side sense MOS 10H2 including an NMOS having the same process as the high-side switching element 3, is inserted in series between the first high-side sense MOS 10H1 and the terminal OUT, and is controlled over on and off with a gate signal INH_S, a third high-side sense MOS 10H3 including an NMOS having the same process as the high-side switching element 3, is connected in parallel to the first high-side sense MOS 10H1, and is always on, and a virtual short circuit 10H4, including an operational amplifier and a PMOS, for causing a midpoint between the first high-side sense MOS 10H1 and the second high-side sense MOS 10H2 and a source terminal of the third high-side sense MOS to be at the same potential.

Figure 22:
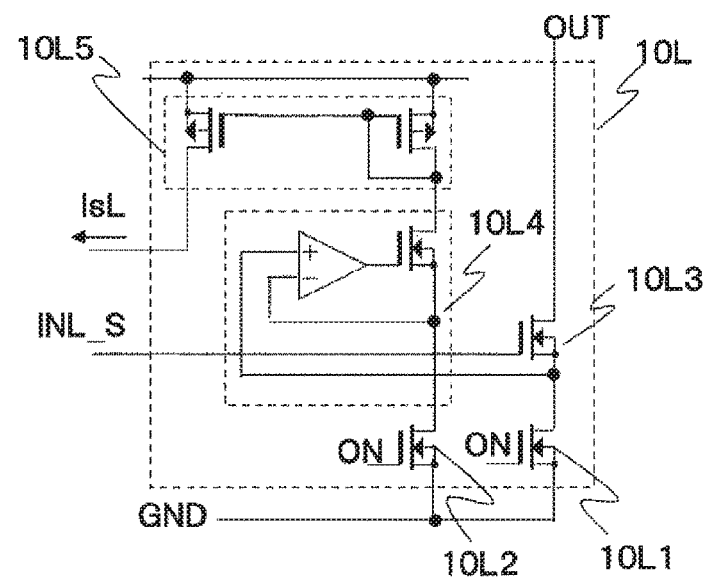
FIG. 22 is a block diagram illustrating an example of the configuration of a low-side current detection circuit according to the seventh embodiment of the present invention.

In FIG. 22, it is a block diagram illustrating an example of the configuration of the low-side current detection circuit 10L according to the seventh embodiment of the present invention.

The high-side current detection circuit 10L illustrated in FIG. 22 includes a first low-side sense MOS 10L1 including an NMOS having the same process as the low-side switching element 4, and is always on, a second low-side sense MOS 10L2 including an NMOS having the same process as the low-side switching element 4, is inserted in series between the first low-side sense MOS 10L1 and the terminal OUT, and is controlled over on and off with a gate signal INL_S, a third low-side sense MOS 10L3 including an NMOS having the same process as the low-side switching element 4, is connected in parallel to the first low-side sense MOS 10L1, and is always on, and a virtual short circuit 10L4, including an operational amplifier and an NMOS, for causing a midpoint between the first low-side sense MOS 10L1 and the second low-side sense MOS 10L2 and the drain terminal of the third low-side sense MOS to be at the same potential.

Figure 23:
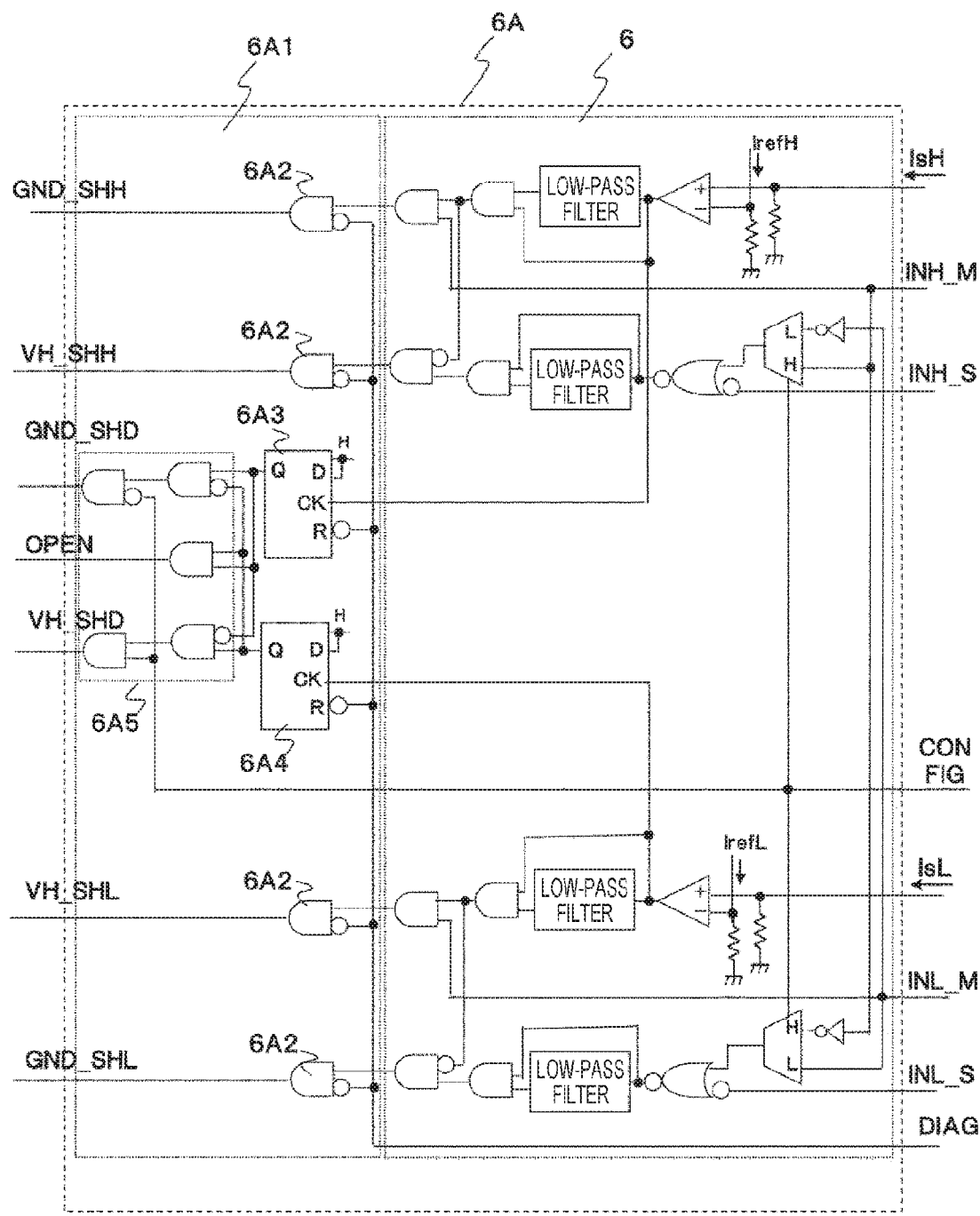
FIG. 23 is a block diagram illustrating an example of the configuration of a fault detection circuit according to the seventh embodiment of the present invention.

In FIG. 23, it is a block diagram illustrating an example of the configuration of the fault detection circuit 6A according to the seventh embodiment of the present invention.

The fault detection circuit 6A illustrated in FIG. 23 includes the fault detection circuit 6 illustrated in FIG. 14, which is the fault detection circuit of when the load-driving circuit 1G is in normal load driving operation, and an OFF-time fault detection circuit 6A1 that operates during the diagnosis period required by a system within the period when the load is not driven.

The OFF-time fault detection circuit 6A1 includes logic circuits 6A2 that fix the outputs (VH_SHH, VH_SHL, GND_SHH, and GND_SHL) of the fault detection circuit 6 to L during the diagnosis period, a latch circuit 6A3 that compares the high-side sense current IsH and a threshold current IrefH, and outputs H on the rising edge when an increase of IsH to or above IrefH is detected, and outputs L when DIAG=L, a latch circuit 6A4 that compares the low-side sense current IsL and a threshold current IrefL, and outputs H on the rising edge when an increase of IsL to or above IrefL is detected, and outputs L when DIAG=L, and a determination circuit 6A5 that determines a fault—the power source fault, the ground fault, or an open-circuit fault—from the outputs of the latch circuits 6A3 and 6A4.

Figure 24:
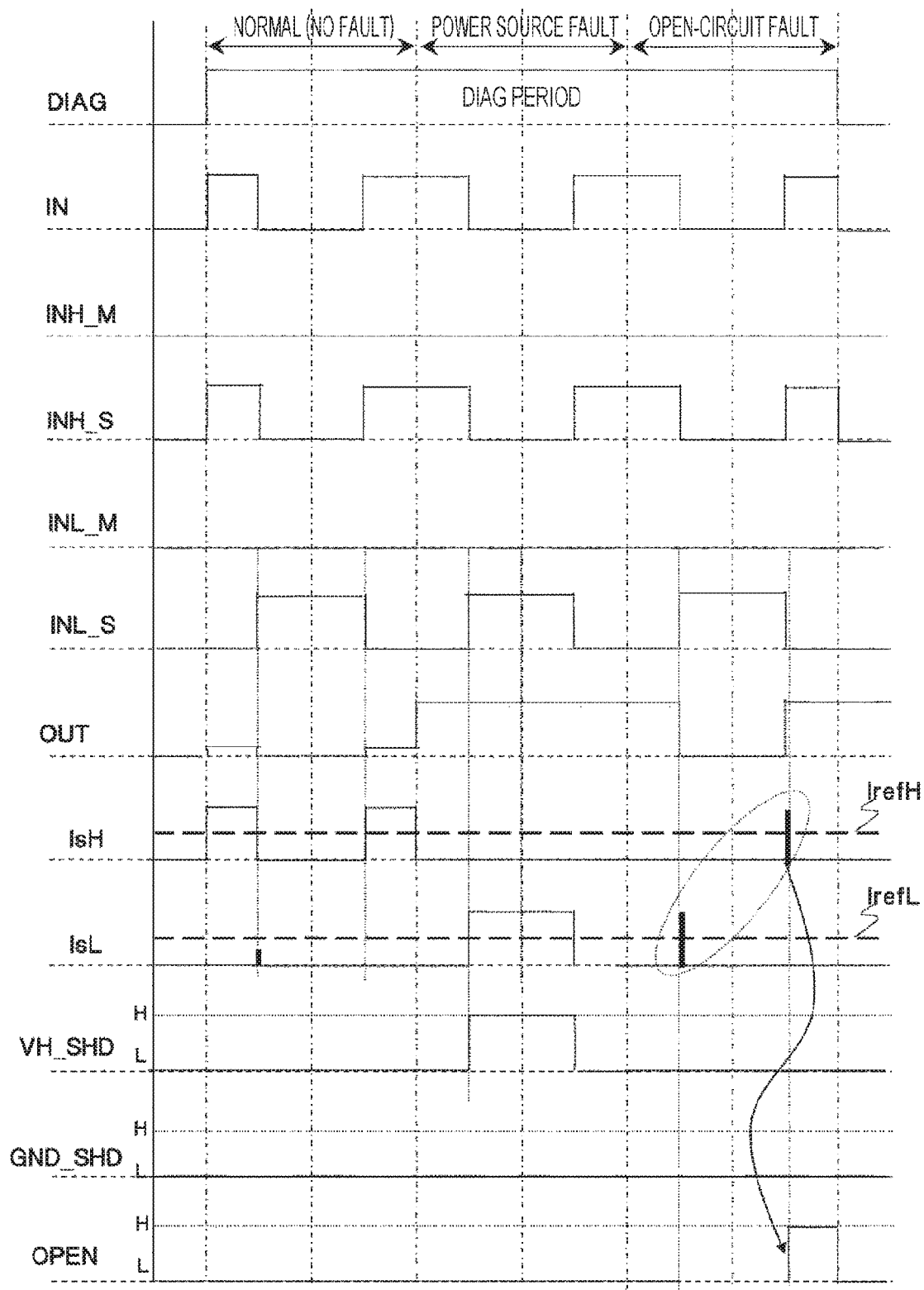
FIG. 24 is a timing chart illustrating an example of the circuit operation of a high-side driver configuration according to the seventh embodiment of the present invention.

FIG. 24 illustrates an example of a timing chart of the high-side driver configuration according to the seventh embodiment of the present invention. The timing chart illustrated in FIG. 24 describes the operation and effect in the normal, power source fault, and open-circuit fault states.

Since it is the high-side driver configuration, the CONFIG signal outputs H. Since it is the diagnosis period, the DIAG signal is at H. Accordingly, the gate signal INH_M of the high-side switching element 3 and the gate signal INL_M of the low-side switching element 4 are fixed to off. The gate signal INH_S of the high-side sense MOS 10H3 and the gate signal INL_S of the low-side sense MOS 10L3 are alternately turned on and off.

When the load-driving circuit 1G is in the normal state, the OUT terminal has a potential near GND. Accordingly, the high-side sense current IsH is equal to or more than the threshold current IrefH when INH_S is on, and then the latch circuit 6A3 outputs H. The low-side sense current IsL is equal to or less than the threshold current IrefL when INL_S is on, and then the latch circuit 6A4 outputs L. At this point in time, the determination circuit 6A5 determines that the load-driving circuit 1G is in the normal state from the outputs of the latch circuits 6A3 and 6A4.

When the load-driving circuit 1G is in the power source fault state, the OUT terminal has a potential near VH. Accordingly, the high-side sense current IsH is equal to or less than the threshold current IrefH when INH_S is on, and then the latch circuit 6A3 outputs L. The low-side sense current IsL is equal to or more than the threshold current IrefL when INL_ is on, and then the latch circuit 6A4 outputs H. At this point in time, VH_SHD=H from the outputs of the latch circuits 6A3 and 6A4, and then the determination bottleneck 6A5 determines that the load-driving circuit 1G is in the power source fault state.

When the load-driving circuit 1G is in the open-circuit state, the OUT terminal has high impedance. Accordingly, the OUT terminal has a potential near VH when INH_S is on and has a potential near GND when INL_S is on. When INH_S transitions from on to off and INL_S transitions from off to on, the OUT terminal transitions from the potential near VH to the potential near GND. Accordingly, a current equal to or more than IrefL is momentarily generated in terms of INL_S, and then the lath circuit 6A4 outputs H. When INL_S transitions from on to off and INH_S transitions from off to on, the OUT terminal transitions from the potential near GND to the potential near VH. Accordingly, a current equal to or more than IrefH is momentarily generated in terms of INH_S, and then the latch circuit 6A3 outputs H. At this point in time, OPEN=H from the outputs of the latch circuits 6A3 and 6A4, and the determination circuit 6A5 determines that the load-driving circuit 1G is in the open-circuit state.

Figure 25:
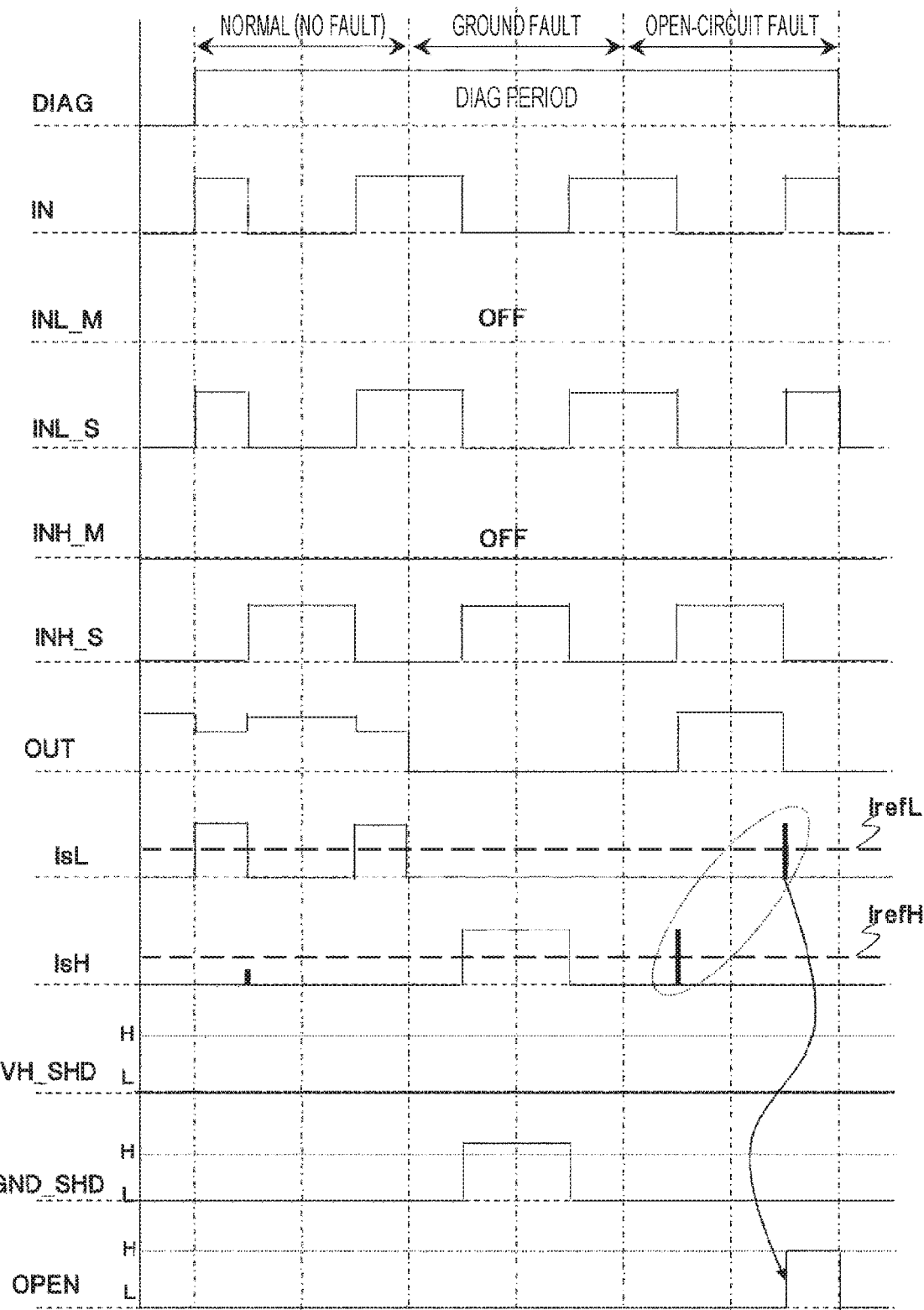
FIG. 25 is a timing chart illustrating an example of the circuit operation of a low-side driver configuration according to the seventh embodiment of the present invention.

FIG. 25 illustrates an example of a timing chart of the low-side driver configuration according to the seventh embodiment of the present invention. The timing chart illustrated in FIG. 25 describes the operation and effect in the normal, ground fault, and open-circuit fault states.

Since it is the low-side driver configuration, the CONFIG signal outputs L. Since it is the diagnosis period, the DIAG signal outputs H. The gate signal INH_M of the high-side switching element 3 and the gate signal INL_M of the low-side switching element 4 are fixed to off. The gate signal INH_S of the high-side sense MOS 10H3 and the gate signal INL_S of the low-side sense MOS 10L3 are alternately turned on and off.

When the load-driving circuit 1G is in the normal state, the OUT terminal has a potential near VH. Accordingly, the low-side sense current IsL is equal to or more than the threshold current IrefL when INL_S is on, and then the latch circuit 6A4 outputs H. The high-side sense current IsH is equal to or less than the threshold current IrefH when INH_S is on, and then the latch circuit 6A3 outputs L. At this point in time, the determination circuit 6A5 determines that the load-driving circuit 1G is in the normal state from the outputs of the latch circuits 6A3 and 6A4.

When the load-driving circuit 1G is in the ground fault state, the OUT terminal has a potential near GND. Accordingly, the low-side sense current IsL is equal to or less than the threshold current IrefL when INL_S is on, and then the latch circuit 6A4 outputs L. The high-side sense current IsH is equal to or more than the threshold current IrefH when INH_ is on, and then the latch circuit 6A3 outputs H. At this point in time, GND_SHD=H from the outputs of the latch circuits 6A3 and 6A4, and the determination circuit 6A5 determines that the load-driving circuit 1G is in the ground fault state.

When the load-driving circuit 1G is in the open-circuit state, the OUT terminal has high impedance. Accordingly, the OUT terminal has a potential near VH when INH_S is on and has a potential near GND when INL_S is on. When INH_S transitions from on to off, and INL_S from off to on, the OUT terminal transitions from the potential near VH to the potential near GND. Accordingly, a current equal to or more than IrefL is momentarily generated in terms of INL_S, and then the latch circuit 6A4 outputs H. When INL_S transitions from on to off, and INH_S from off to on, the OUT terminal transitions from the potential near GND to the potential near VH. Accordingly, a current equal to or more than IrefH is momentarily generated in terms of INH_S, and then the latch circuit 6A3 outputs H. At this point in time, OPEN=H from the outputs of the latch circuits 6A3 and 6A4, and the determination circuit 6A5 determines that the load-driving circuit 1G is in the open-circuit state.

As described above, in the load-driving circuit 1G according to the embodiment, a fault can be detected before the load driving operation in addition to the fault detection during the normal load driving operation. Accordingly, a fault can be detected without generating a large current. Accordingly, it is advantageous in further improving reliability and safety.

Moreover, optimum values are respectively set for the threshold currents IrefH and IrefL before and after the load driving operation. Accordingly, it is advantageous in improving the reliability of a fault detection result.

Moreover, the high-side driver configuration and the low-side driver configuration are switched by the CONFIG signal. Accordingly, a fault can be detected not based on the power source connected to the electromagnetic load 2. Accordingly, it is advantageous in making the load-driving circuit 1G flexible.

In the embodiment, the fault detection during the load driving operation is not an essential element. It is also possible to detect a fault before the load driving operation with only constituent elements necessary to detect a fault before the load driving operation.

Eighth Embodiment

Figure 26:
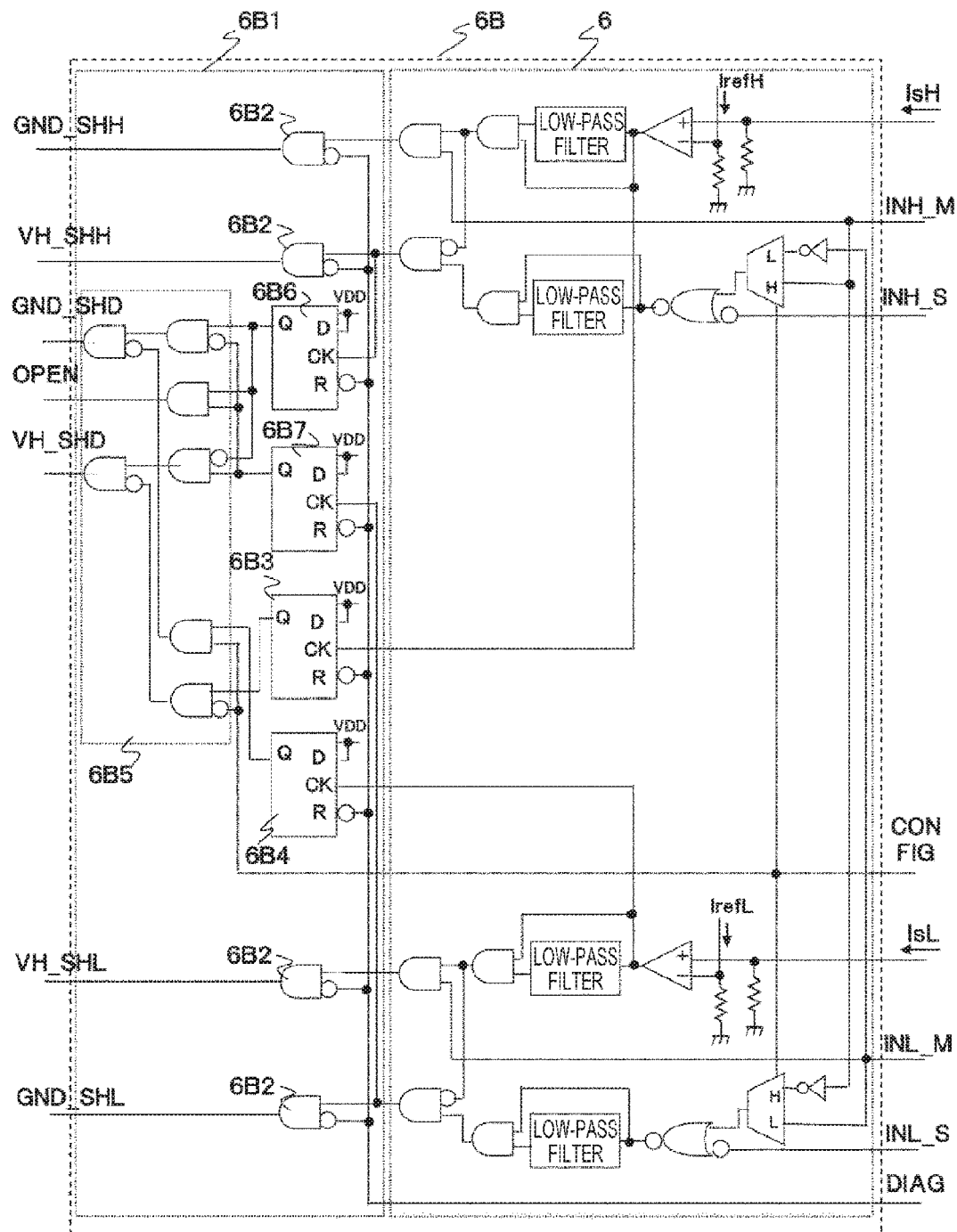
FIG. 26 is a block diagram illustrating an example of the configuration of a fault detection circuit according to an eighth embodiment of the present invention.

In FIG. 26, it is a block diagram illustrating the configuration of a fault detection circuit 6B in the load-driving circuit 1G according to an eighth embodiment of the present invention.

The fault detection circuit 6B illustrated in FIG. 26 includes the fault detection circuit 6 illustrated in FIG. 14, which is the fault detection circuit of when the load-driving circuit 1G is in normal load driving operation, and an OFF-time fault detection circuit 6B1 that operates during a diagnosis period required by a system within a period when the load is not driven.

The OFF-time fault detection circuit 6B1 includes logic circuits 6B2 that fix the outputs of the fault detection circuit 6 to L during the diagnosis period, a latch circuit 6B3 that compares the high-side sense current IsH and the threshold current IrefH, and outputs H on the rising edge when an increase of the high-side sense current IsH to or above the threshold current IrefH is detected, a latch circuit 6B6 that outputs H on the rising edge of an output obtained by applying the low-pass filter to the result of the detection that IsH has increased to or above IrefH, a latch circuit 6B4 that outputs H on the rising edge when an increase of the low-side sense current IsL to or above the threshold current IrefL is detected, a latch circuit 6B7 that outputs H on the rising edge of an output obtained by applying the low-pass filter to the result of the detection that IsL has increased to or above IrefL, and a determination circuit 6B5 that determines faults—the power source fault, the ground fault, and the open-circuit fault—from the outputs of the latch circuits 6B3, 6B4, 6B6, and 6B7.

Figure 27:
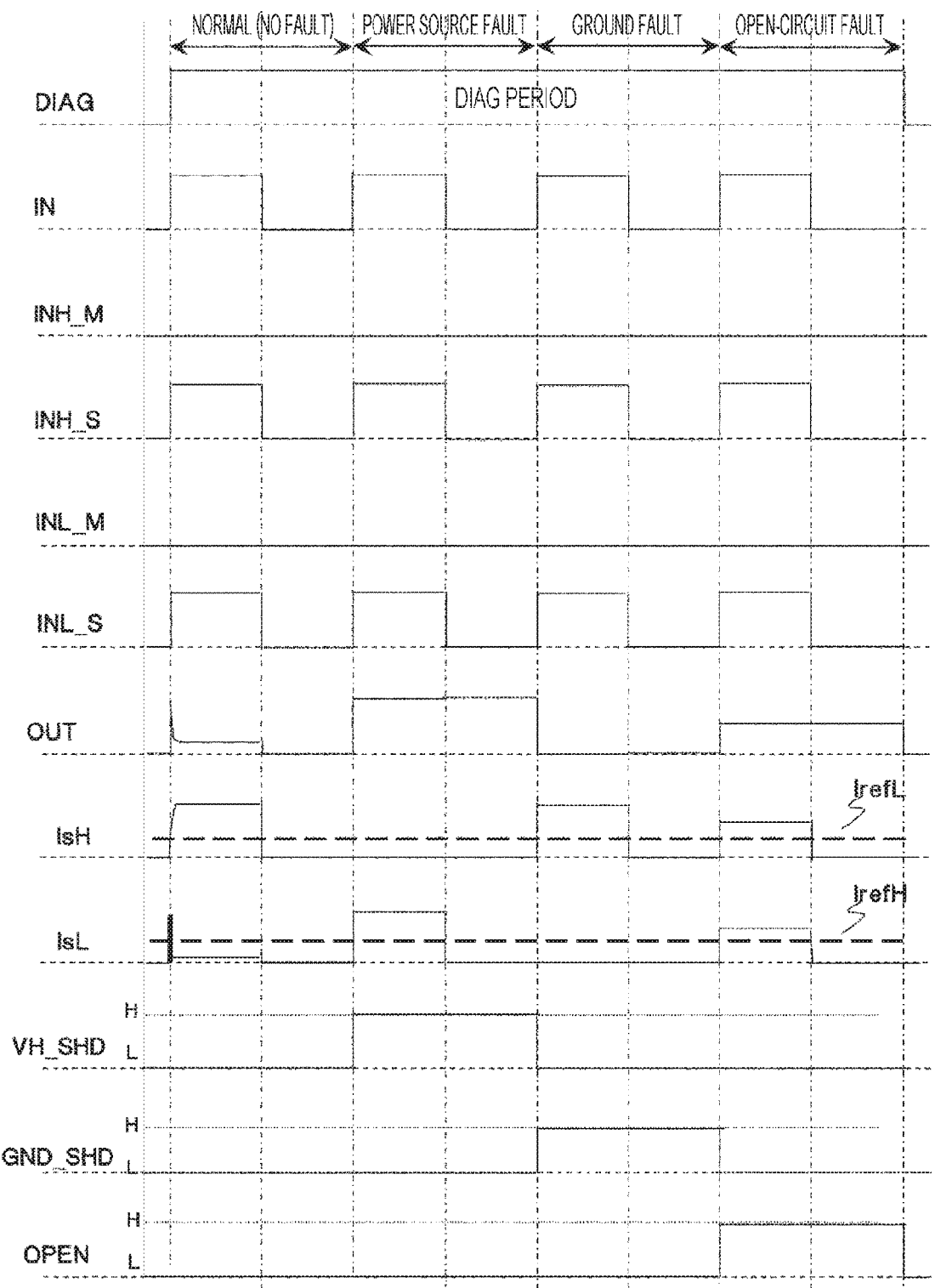
FIG. 27 is a timing chart illustrating an example of the circuit operation of a high-side driver configuration according to the eighth embodiment of the present invention.

FIG. 27 illustrates an example of a timing chart of the high-side driver configuration according to the eighth embodiment of the present invention. The timing chart illustrated in FIG. 27 describes the operation and effect in the normal, power source fault, ground fault, and open-circuit fault states. Since it is the high-side driver configuration, the CONFIG signal outputs H. Since it is the diagnosis period, the DIAG signal is at H. Accordingly, the gate signal INH_M of the high-side switching element 3 and the gate signal INL_M of the low-side switching element 4 are fixed to off. The gate signal INH_S of the high-side sense MOS 10H3 and the gate signal INL_S of the low-side sense MOS 10L3 are simultaneously turned on and off.

When the load-driving circuit 1G is in the normal state and both of INH_S and INL_S are off, the potential is one near GND. At an instant when INH_S and INL_S are simultaneously turned on, the electromagnetic load 2 prevents the flow of current, and the potential of the OUT terminal increases from the one near GND. Accordingly, a current equal to or more than IrefL is momentarily generated in terms of IsL, and then the latch circuit 6B4 outputs H. The potential of the OUT terminal subsequently returns to the one near GND. Accordingly, a current equal to or more than the threshold current IrefH is generated in terms of IsH, and then the latch circuit 6B3 outputs H. Moreover, the OUT terminal has the potential near GND after the passage of a filtering time. Accordingly, a current equal to or more than IrefH is generated in terms of IsH, and IsL becomes a current equal to or less than IrefL. Accordingly, the latch circuit 6B6 outputs H and the latch circuit 6B7 outputs L. At this point in time, the determination circuit 6B5 determines that it is the normal state from the outputs of the latch circuits 6B3, 6B4, 6B6, and 6B7.

When the load-driving circuit 1G is in the power source fault state, the OUT terminal has a potential near VH. Accordingly, at an instant when INH_S and INL_S are simultaneously turned on, a current equal to or more than IrefL is generated in terms of IsL. Accordingly, the latch circuit 6B4 outputs H. IsH becomes a current equal to or less than IrefH. Accordingly, the latch circuit 6B3 outputs L. After the passage of the filtering time, the current equal to or more than IrefL still is generated in terms of IsL. Accordingly, the latch circuit 6B7 outputs H. IsH is the current equal to or less than IrefH. Accordingly, the latch circuit 6B6 outputs L. At this point in time, VH_SHD from the outputs of the latch circuits 6B3, 6B4, 6B6, and 6B7, and the determination circuit 6B5 determines that it is the power source fault state.

When the load-driving circuit 1G is in the ground fault state, at an instant when INH_S and INL_S are simultaneously turned on, the OUT terminal has a potential near GND. Accordingly, a current equal to or more than IrefH is generated in terms of IsH, and then the latch circuit 6B3 outputs H. ISL becomes a current equal to or less than IrefL. Accordingly, the latch circuit 6B4 outputs L. After the passage of the filtering time, the OUT terminal still has the potential near GND. Accordingly, the current equal to or more than IrefH is generated in terms of IsH, and then the latch circuit 6B6 outputs H. ISL is the current equal to or less than IrefL. Accordingly, the latch circuit 6B7 outputs L. At this point in time, GND_SHD=H from the outputs of the latch circuits 6B3, 6B4, 6B6, and 6B7, and the determination circuit 6B5 determines that it is the ground fault state.

When the load-driving circuit 1G is in the open-circuit fault state, at an instant when INH_S and INL_S are simultaneously turned on, the OUT terminal has a midpoint potential between GND and VH. Accordingly, a current equal to or more than IrefH is generated in terms of IsH, and then the latch circuit 6B3 outputs H. A current equal to or more than IrefL is generated in terms of IsL, and then the latch circuit 6B4 outputs H. After the passage of the filtering time, the OUT terminal still has the midpoint potential between GND and VH. Accordingly, the current equal to or more than IrefH is generated in terms of IsH, and then the latch circuit 6B6 outputs H. The current equal to or more than IrefL is generated in terms of IsL, and then the latch circuit 6B7 outputs H. At this point in time, OPEN=H from the outputs of the latch circuits 6B3, 6B4, 6B6, and 6B7, and the determination circuit 6B5 determines that it is the open-circuit state.

Figure 28:
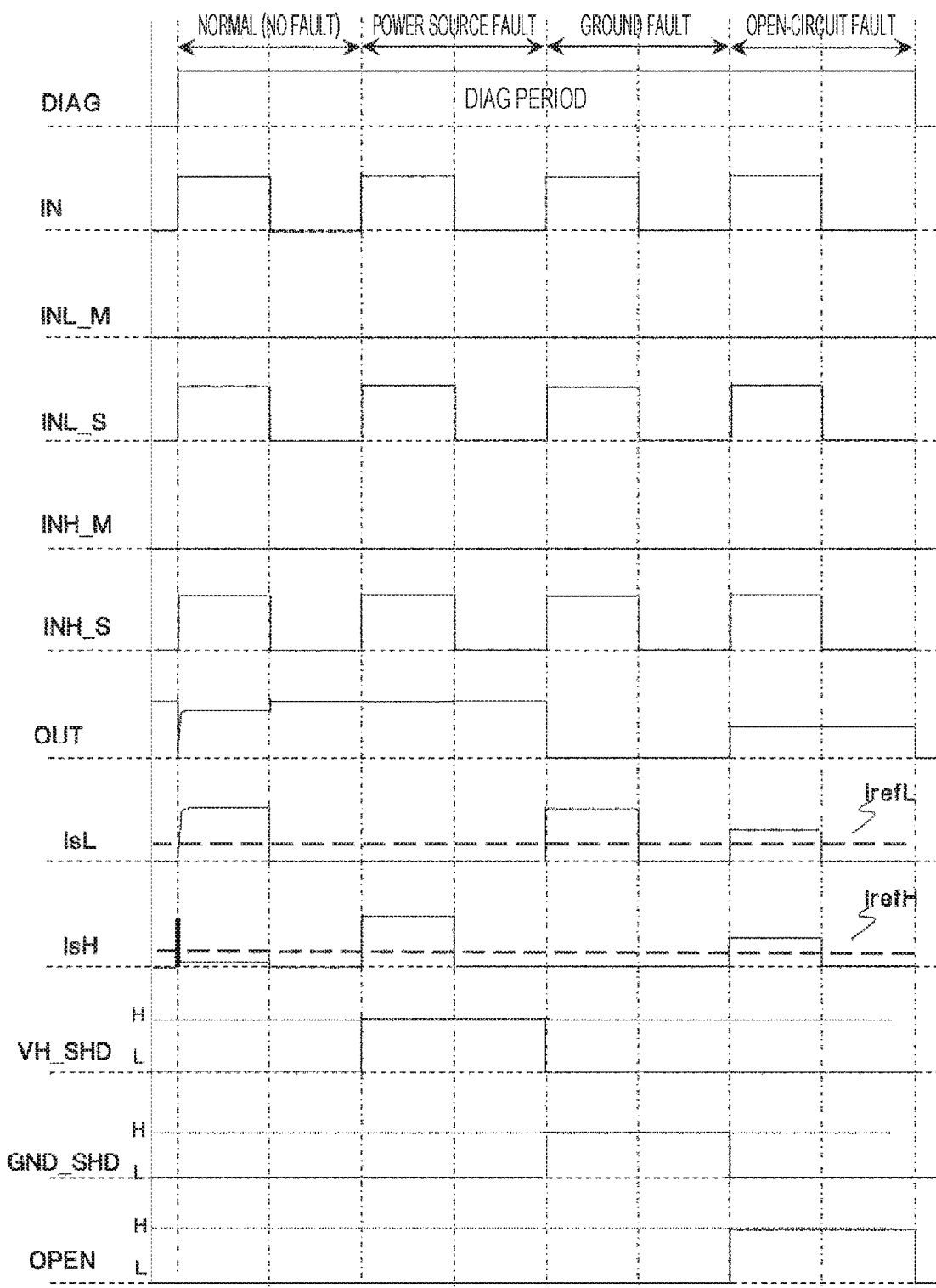
FIG. 28 is a timing chart illustrating an example of the circuit operation of a low-side driver configuration according to the eighth embodiment of the present invention.

FIG. 28 illustrates an example of a timing chart of the low-side driver configuration according to the eighth embodiment of the present invention. The timing chart illustrated in FIG. 28 describes the operation and effect in the normal, power source fault, ground fault, and open-circuit fault states.

Since it is the low-side driver configuration, the CONFIG signal outputs L. Since it is the diagnosis period, the DIAG signal is at H. Accordingly, the gate signal INH_M of the high-side switching element 3 and the gate signal INL_M of the low-side switching element 4 are fixed to off. The gate signal INH_S of the high-side sense MOS 10H3 and the gate signal INL_S of the low-side sense MOS 10L3 are simultaneously turned on and off.

When the load-driving circuit 1G is in the normal state, and both of INH_S and INL_S are off, the potential is one near VH. At an instant when INH_S and INL_S are simultaneously turned on, the electromagnetic load 2 prevents the flow of current. The potential of the OUT terminal decreases from the potential near VH. Accordingly, a current equal to or more than IrefH is momentarily generated in terms of IsH, and then the latch circuit 6B3 outputs H. The potential of the OUT terminal subsequently returns to the one near VH. Accordingly, a current equal to or more than IrefL is generated in terms of IsL, and the latch circuit 6B4 outputs H. Moreover, after the passage of the filtering time, the OUT terminal has a potential near VH. Accordingly, a current equal to or more than IrefL is generated in terms of IsL, and then the latch circuit 6B7 outputs H. IsH becomes a current equal to or less than IrefH, and then the latch circuit 6B6 outputs L. At this point in time, the determination circuit 6B5 determines that it is the normal state from the outputs of the latch circuits 6B3, 6B4, 6B6, and 6B7.

When the load-driving circuit 1G is in the power source fault state, the OUT terminal has a potential near VH.

Accordingly, at an instant when INH_S and INL_S are simultaneously turned on, a current equal to or more than IrefL is generated in terms of IsL, and then the latch circuit 6B4 outputs H. IsH becomes a current equal to or less than IrefH, and then the latch circuit 6B3 outputs L. After the passage of the filtering time, the current equal to or more than IrefL is still generated in terms of IsL, and accordingly the latch circuit 6B7 outputs H. IsH becomes the current equal to or less than IrefH. Accordingly, the latch circuit 6B6 outputs L. At this point in time, VH_SHD=H from the outputs of the latch circuits 6B3, 6B4, 6B6, and 6B7, and the determination circuit 6B5 determines that it is the power source fault state.

When the load-driving circuit 1G is in the ground fault state, at an instant when INH_S and INL_S are simultaneously turned on, the OUT terminal has a potential near GND. Accordingly, a current equal to or more than IrefH is generated in terms of IsH, and then the latch circuit 6B3 outputs H. ISL becomes a current equal to or less than IrefL, and then the latch circuit 6B4 outputs L. After the passage of the filtering time, the OUT terminal still has the potential near GND. Accordingly, the current equal to or more than IrefH is generated in terms of IsH, and then the latch circuit 6B6 outputs H. ISL becomes the current equal to or less than IrefL, and then the latch circuit 6B7 outputs L. At this point in time, GND_SHD=H from the outputs of the latch circuits 6B3, 6B4, 6B6, and 6B7, and the determination circuit 6B5 determines that it is the ground fault state.

When the load-driving circuit 1G is in the open-circuit state, at an instant when INH_S and INL_S are simultaneously turned on, the OUT terminal has a midpoint potential between GND and VH. A current equal to or more than IrefH is generated in terms of IsH, and then the latch circuit 6B3 outputs H. A current equal to or more than IrefL is generated in terms of IsL, and then the latch circuit 6B4 outputs H. After the passage of the filtering time, the OUT terminal still has the midpoint potential between GND and VH. Accordingly, the current equal to or more than IrefH is generated in terms of IsH, and then the latch circuit 6B6 outputs H. The current equal to or more than IrefL is generated in terms of IsL, and then the latch circuit 6B7 outputs H. At this point in time, OPEN=H from the outputs of the latch circuits 6B3, 6B4, 6B6, and 6B7, and the determination circuit 6B5 determines that it is the open-circuit state.

As described above, in the load-driving circuit 1G according to the embodiment, a fault can be detected, distinguishing between the power source fault, the ground fault, and the open-circuit fault, before the load driving operation, in addition to the fault detection during the load driving operation. A fault can be detected without generating a large current. Accordingly, it is advantageous in further improving reliability and safety.

Moreover, optimum values are respectively set for the threshold currents IrefH and IrefL before and after the load driving operation. Accordingly, it is advantageous in further improving the reliability of a fault detection result.

Moreover, the high-side driver configuration and the low-side driver configuration are switched by the CONFIG signal. Accordingly, a fault can be detected not based on the power source connected to the electromagnetic load 2. Accordingly, it is advantageous in making the load-driving circuit 1G flexible.

In the embodiment, the fault detection during the load driving operation is not an essential element. It is also possible to detect a fault before the load driving operation with only constituent elements necessary to detect a fault before the load driving operation.

The present invention is not limited to the embodiments, and includes various modifications. For example, the embodiments are those described in detail to facilitate the understanding of the present invention, and are not necessarily limited to those including all the described configurations. Moreover, part of the configuration of a given embodiment can be replaced with the configuration of another embodiment. Moreover, the configuration of a given embodiment can also be added to the configuration of another embodiment. Moreover, another configuration can be added to, removed from, and replaced with part of the configuration of each embodiment. Moreover, in terms of the control lines and information lines, those considered to be necessary for description are illustrated. Not all the control lines and information lines are always illustrated in terms of the product. For example, in the present invention, the example is illustrated in which the high-side switching element 3, the low-side switching element 4, the high-side sense MOS 5H, and the low-side sense MOS 5L are each including an NMOS. However, even if they are each including a PMOS, a similar effect to the case of including an NMOS can be obtained if the polarities of the high level and the low level of the gate signal for controlling on and off are inverted.

Moreover, the high-side current detection circuit 10H and the high-side current detection circuit 10L, which are described in the seventh and eighth embodiments, can also be applied to the high-side current detection circuit 5H and the low-side current detection circuit 6L, which are described in the first to sixth embodiments.

Moreover, the high-side current detection circuit 5H and the low-side current detection circuit 10L, which are described in the first to sixth embodiments, are applied to the high-side current detection circuit 10H and the low-side current detection circuit 10L, which are described in the seventh and eighth embodiments, to enable the detection of faults other than the open-circuit fault before the load driving operation.

REFERENCE SIGNS LIST 1 load-driving circuit
2 electromagnetic load
3 high-side switching element
4 low-side switching element
5H high-side current detection circuit
5L low-side current detection circuit
6 fault detection circuit
6H high-side fault detection circuit
6L low-side fault detection circuit
7 pre-driver
8 fault result comparison circuit
10H high-side current detection circuit
10L low-side current detection circuit

The invention claimed is:

1. A load-driving circuit for receiving the supply of power from a power source to drive a load, the load-driving circuit comprising:
a high-side switching element, connected to a positive electrode side of the power source, for outputting a high-side driving current;
a low-side switching element, connected to a negative electrode side of the power source, for outputting a low-side driving current;
a high-side current detection circuit, connected in parallel to the high-side switching element, for detecting the high-side driving current; and a fault detection circuit for detecting a fault state of the load-driving circuit from an output result of the high-side current detection circuit, wherein the high-side current detection circuit includes a high-side sense switching element, including a device of the same type as the high-side switching element, for operating on a gate signal different from that of the high-side switching element, and when a connection terminal between the load-driving circuit and the load is short-circuited to the positive electrode side of the power source, or short-circuited to the negative electrode side of the power source, the fault detection circuit detects the fault states distinguishing them, with the output result of the high-side current detection circuit, the gate signal of the high-side switching element, and the gate signal of the high-side sense switching element as inputs.

2. The load-driving circuit according to claim 1, wherein a period during which the gate signal of the high-side sense switching element is in the on state is longer than a period during which the gate signal of the high-side switching element is in the on state.

3. The load-driving circuit according to claim 1, comprising a pre-driver circuit for outputting the gate signal of the high-side switching element, a gate signal of the low-side switching element, and the gate signal of the high-side sense switching element based on a control signal of the load-driving circuit and an output result of the fault detection circuit.

4. A load-driving circuit for receiving the supply of power from a power source to drive a load, the load-driving circuit comprising:

a high-side switching element, connected to a positive electrode side of the power source, for outputting a high-side driving current;

a low-side switching element, connected to a negative electrode side of the power source, for outputting a low-side driving current;

a low-side current detection circuit, connected in parallel to the low-side switching element, for detecting the low-side driving current; and a fault detection circuit for detecting a fault state of the load-driving circuit from an output result of the low-side current detection circuit, wherein the low-side current detection circuit includes a low-side sense switching element, including a device of the same type as the low-side switching element, for operating on a gate signal different from that of the low-side switching element, and when a connection terminal between the load-driving circuit and the load is short-circuited to the positive electrode side of the power source, or short-circuited to the negative electrode side of the power source, the fault detection circuit detects the fault states distinguishing them from the gate signal of the low-side switching element and the gate signal of the low-side sense switching element, with the output result of the low-side current detection circuit as an input.

5. The load-driving circuit according to claim 4, wherein a period during which the gate signal of the low-side sense switching element is in the on state is longer than a period during which the gate signal of the low-side switching element is in the on state.

6. The load-driving circuit according to claim 4, comprising a pre-driver circuit for outputting the gate signal of the low-side switching element, a gate signal of the high-side switching element, and the gate signal of the low-side sense switching element based on a control signal of the load-driving circuit and an output result of the fault detection circuit.

7. A load-driving circuit for receiving the supply of power from a power source to drive a load, the load-driving circuit comprising:

a high-side switching element, connected to a positive electrode side of the power source, for outputting a high-side driving current;

a low-side switching element, connected to a negative electrode side of the power source, for outputting a low-side driving current;

a fault detection circuit for detecting a fault state of the load-driving circuit;

a high-side current detection circuit, connected in parallel to the high-side switching element, for detecting the high-side driving current; and a low-side current detection circuit, connected in parallel to the low-side switching element, for detecting the low-side driving current, wherein the high-side current detection circuit includes a high-side sense switching element, including a device of the same type as the high-side switching element, for operating on a gate signal different from that of the high-side switching element, the low-side current detection circuit includes a low-side sense switching element, including a device of the same type as the low-side switching element, for operating on a gate signal different from that of the low-side switching element, and when a connection terminal between the load-driving circuit and the load is short-circuited to the positive electrode side of the power source, or short-circuited to the negative electrode side of the power source, the fault detection circuit detects the fault states distinguishing them from the gate signal of the high-side switching element, the gate signal of the high-side sense switching element, the gate signal of the low-side switching element, and the gate signal of the low-side sense switching element, with an output result of the high-side current detection circuit and an output result of the low-side current detection circuit as inputs.

8. The load-driving circuit according to claim 7, wherein a period during which the gate signal of the high-side sense switching element is in the on state is longer than a period during which the gate signal of the high-side switching element is in the on state, and a period during which the gate signal of the low-side sense switching element is in the on state is longer than a period during which the gate signal of the low-side switching element is in the on state.

9. The load-driving circuit according to claim 7, comprising a pre-driver circuit for outputting the gate signal of the low-side switching element, the gate signal of the high-side switching element, the gate signal of the low-side sense switching element, and the gate signal of the high-side sense switching element based on a control signal of the load-driving circuit and an output result of the fault detection circuit.

10. The load-driving circuit according to claim 7, comprising a detection result comparison circuit for making a comparison such that an output result of the fault detection circuit based on the output result of the high-side current detection circuit agrees with an output result of the fault detection circuit based on the output result of the low-side current detection circuit in each control period of the load-driving circuit and accordingly mutually diagnosing the output results of the high-side current detection circuit and the low-side current detection circuit as normal.

11. The load-driving circuit according to claim 7, wherein
a fault detection period of the load-driving circuit is set in a standby state where the load-driving circuit does not drive the load,
logic circuits for fixing the gate signal of the high-side switching element and the gate signal of the low-side switching element to off during the fault detection period are included, and
a fault state of the load-driving circuit is detected by turning on and off the gate signal of the high-side sense switching element and the gate signal of the low-side sense switching element.

12. The load-driving circuit according to claim 11, wherein the gate signal of the high-side sense switching element and the gate signal of the low-side sense switching element are alternately turned on and off to detect a fault state.

13. The load-driving circuit according to claim 11, wherein the gate signal of the high-side sense switching element and the gate signal of the low-side sense switching element are simultaneously turned on and off to detect a fault state.

14. The load-driving circuit according to claim 13, wherein a fault state of the load-driving circuit is detected from output results of the high-side current detection circuit and the low-side current detection circuit at an instant when the gate signal of the high-side sense switching element and the gate signal of the low-side sense switching element are turned on, and output results of the high-side current detection circuit and the low-side current detection circuit after the passage of a fixed time since the turn-on.

15. The load-driving circuit according to claim 7, wherein the fault detection circuit includes a control terminal for switching the fault detection of the load-driving circuit for each of a configuration where an opposite terminal of the load to a terminal connected to the load-driving circuit is connected to the positive electrode side of the power source, and a configuration where the opposite terminal is connected to the negative electrode side of the power source.

* * * * *